(12) United States Patent
Doh et al.

(10) Patent No.: US 12,552,680 B2
(45) Date of Patent: Feb. 17, 2026

(54) METHOD OF MANUFACTURING INORGANIC OXIDE PARTICLE, METHOD OF MANUFACTURING INORGANIC OXIDE LAYER, AND LIGHT-EMITTING DEVICE INCLUDING INORGANIC OXIDE LAYER MANUFACTURED BY THE METHOD

(71) Applicant: Samsung Display Co., Ltd., Yongin-si (KR)

(72) Inventors: Hyunmi Doh, Yongin-si (KR); Changhee Lee, Yongin-si (KR); Jingoo Kang, Yongin-si (KR); Sehun Kim, Yongin-si (KR); Yonghwi Kim, Yongin-si (KR); Jonghoon Kim, Yongin-si (KR); Seunguk Noh, Yongin-si (KR); Myoungjin Park, Yongin-si (KR); Yunku Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 702 days.

(21) Appl. No.: 17/849,542

(22) Filed: Jun. 24, 2022

(65) Prior Publication Data

US 2023/0038085 A1    Feb. 9, 2023

(30) Foreign Application Priority Data

Jun. 28, 2021    (KR) ........................ 10-2021-0084158

(51) Int. Cl.
*C01G 9/02*    (2006.01)
*H10K 50/115*    (2023.01)
(Continued)

(52) U.S. Cl.
CPC ............. *C01G 9/02* (2013.01); *H10K 50/115* (2023.02); *H10K 50/16* (2023.02); *H10K 50/171* (2023.02);
(Continued)

(58) Field of Classification Search
None
See application file for complete search history.

(56) References Cited

U.S. PATENT DOCUMENTS 9,911,938 B2    3/2018   Ko et al.
9,971,265 B1    5/2018   Sacripante et al.
(Continued)

FOREIGN PATENT DOCUMENTS

JP    2011233297 A  *  11/2011
JP         6079118 B2     5/2014
(Continued)

OTHER PUBLICATIONS

Brenner, et al., "Etch-Resistant Zn1-xMgxO Alloys: An Alternative to ZnO for Carboxylic Acid Surface Modification", J. Phys. Chem. C 2014, 118, 24, 12599-12607; doi.org/10.1021/jp500605t (9 pages).
(Continued)

*Primary Examiner* — Hung K Vu
(74) *Attorney, Agent, or Firm* — Womble Bond Dickinson (US) LLP

(57) ABSTRACT

A method of manufacturing an inorganic oxide particle having an inorganic oxide core and a hydroxyl group bonded to a surface thereof includes: preparing a first composition including an inorganic oxide core precursor and a proton supply compound; and heating the first composition. Additional embodiments provide a method of manufacturing an inorganic oxide layer including an inorganic oxide particle
(Continued)

manufactured by the method, and a light-emitting device including an inorganic oxide layer manufactured by the method.

20 Claims, 3 Drawing Sheets

(51) Int. Cl.
*H10K 50/16* (2023.01)
*H10K 50/17* (2023.01)
*H10K 50/18* (2023.01)
*H10K 71/00* (2023.01)
*H10K 102/00* (2023.01)

(52) U.S. Cl.
CPC ............ *H10K 50/18* (2023.02); *H10K 71/00* (2023.02); *C01P 2004/64* (2013.01); *H10K 2102/331* (2023.02); *H10K 2102/351* (2023.02)

(56) References Cited

U.S. PATENT DOCUMENTS

| | | | |
|---|---|---|---|
| 10,236,720 | B2 | 3/2019 | Moon et al. |
| 10,923,668 | B2 | 2/2021 | Park et al. |
| 11,005,058 | B2 | 5/2021 | Zhou et al. |
| 11,011,673 | B2 | 5/2021 | Park et al. |
| 11,031,520 | B2 | 6/2021 | Wenham et al. |
| 11,127,912 | B2 | 9/2021 | Seo et al. |
| 2018/0319993 | A1 | 11/2018 | Clinnin et al. |
| 2019/0115550 | A1 | 4/2019 | Kim et al. |

FOREIGN PATENT DOCUMENTS

| | | |
|---|---|---|
| KR | 10-2034754 B1 | 3/2014 |
| KR | 10-2014-0121346 A | 10/2014 |
| KR | 10-2015-0034616 A | 4/2015 |
| KR | 10-2017-0033130 A | 3/2017 |
| KR | 10-2017-0133837 A | 12/2017 |
| KR | 10-2018-0086209 A | 7/2018 |
| KR | 10-2018-0097450 A | 8/2018 |
| KR | 10-2018-0105873 A | 10/2018 |
| KR | 10-2019-0000941 A | 1/2019 |
| KR | 10-2019-0042192 A | 4/2019 |
| KR | 10-2019-0063544 A | 6/2019 |
| KR | 10-2019-0086535 A | 7/2019 |
| KR | 10-1995371 B1 | 7/2019 |
| KR | 10-2020-0008976 A | 1/2020 |
| KR | 10-2020-0011302 A | 2/2020 |
| KR | 10-2020-0021726 A | 3/2020 |

OTHER PUBLICATIONS

Davi, et al.., "Enhanced Photoelectrochemical Water Oxidation Efficiency 4 2 of CuWO Photoanodes by Surface Modification with AgNCN", J. Phys. Chem. C 2017, 121, 14083-14087; Downloaded from http://pubs.acs.org on Nov. 2, 2017 (12 pages).

Lee, et al., "Inverted Quantum Dot Light-Emitting Diodes with Defect-Passivated ZnO as an Electron Transport Layer", 2019 IOP Publishing Ltd., Semicond. Sci. Technol.; https://doi.org/10.1088/1361-6641/ab2b52 (12 pages).

Sun, et al., "Transparent PMMA/ZnO nanocomposite films based on colloidal ZnO quantum dots", Nanotechnology 2007, 18, 215606; doi: 10.1088/0957-4484/18/21/215606 (7 pages).

Sun, et al., "Enhancing the performance of blue quantum-dot light-emitting diodes through the incorporation of polyethylene glycol to passivate ZnO as an electron transport layer", RSC Adv., 2020, 10 , 23121-23127; DOI: 10.1039/d0ra03846f (7 pages).

Tu, et al., "Transparent and flexible thin films of ZnO-polystyrene nanocomposite for UV-shielding applications", J. Mater. Chem. 2010, 20, 1594-1599; DOI: 10.1039/b914156a (6 pages).

Zhang, et al., "The Positive Aging Effect of ZnO Nanoparticles Induced by Surface Stabilization", J. Phys. Chem. Lett. 2020, 11, 15, 5863; DOI: 10.1021/acs.jpclett.0c01640 (44 pages).

Mine Altunbek et al., Influence of surface properties of zinc oxide nanoparticles on their cytotoxicity, Colloids and Surfaces B: Biointerfaces 121, Jun. 2, 2014, pp. 106-113.

\* cited by examiner

METHOD OF MANUFACTURING INORGANIC OXIDE PARTICLE, METHOD OF MANUFACTURING INORGANIC OXIDE LAYER, AND LIGHT-EMITTING DEVICE INCLUDING INORGANIC OXIDE LAYER MANUFACTURED BY THE METHOD

CROSS-REFERENCE TO RELATED APPLICATION

This application claims priority to and the benefit of Korean Patent Application No. 10-2021-0084158, filed on Jun. 28, 2021, in the Korean Intellectual Property Office, the entire content of which is incorporated herein by reference.

BACKGROUND

1. Field

One or more aspects of embodiments of the present disclosure relate to a method of manufacturing an inorganic oxide particle, a method of manufacturing an inorganic oxide layer, and a light-emitting device including an inorganic oxide layer manufactured by the method.

2. Description of the Related Art

Light-emitting devices are devices that convert electrical energy into light energy. Examples of such light-emitting devices include organic light-emitting devices in which a light-emitting material is an organic material, and quantum dot light-emitting devices in which the light-emitting material is a quantum dot.

In an example light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers (such as holes and electrons) may recombine in the emission layer to produce excitons. These excitons may transition from an excited state to the ground state to thereby generate light.

SUMMARY

One or more aspects of embodiments of the present disclosure are directed toward a method of manufacturing an inorganic oxide particle, a method of manufacturing an inorganic oxide layer, and a light-emitting device including an inorganic oxide layer manufactured by the method, and for example, a method of manufacturing an inorganic oxide particle capable of reducing oxygen vacancies in inorganic oxides, a method of manufacturing an inorganic oxide layer including the inorganic oxide particle, and a light-emitting device including an inorganic oxide layer manufactured by the method.

Additional aspects will be set forth in part in the description that follows, and will be apparent in part from the description, or may be learned by practice of the presented embodiments of the disclosure.

One or more embodiments of the present disclosure provide a method of manufacturing an inorganic oxide particle including an inorganic oxide core and a hydroxyl group bonded to a surface of the inorganic oxide core, the method including:
preparing a first composition including an inorganic oxide core precursor and a proton supply compound, and heating the first composition,
wherein the proton supply compound includes a carboxylic acid-containing compound, a peroxide-containing compound, or a combination thereof.

One or more embodiments of the present disclosure provide a method of manufacturing an inorganic oxide layer including an inorganic oxide core and a hydroxyl group bonded to a surface of the inorganic oxide core, the method including:
providing, on a substrate, a second composition including the inorganic oxide particle and a second solvent, and heating the second composition.

One or more embodiments of the present disclosure provide a light-emitting device including:
a first electrode, a second electrode facing the first electrode, and an interlayer located between the first electrode and the second electrode and including an emission layer and an inorganic oxide layer,
wherein the inorganic oxide layer is manufactured according to the method of manufacturing the inorganic oxide layer as described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
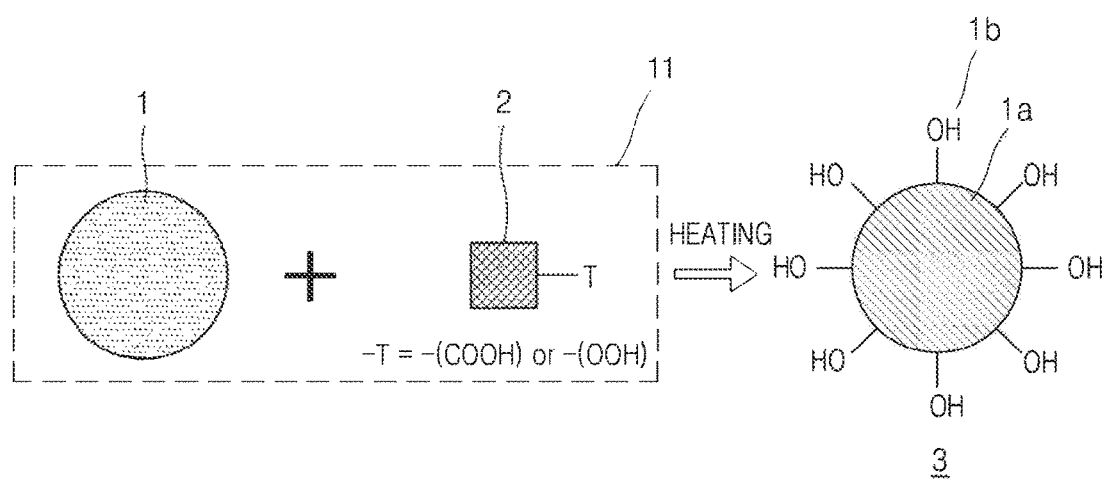
FIG. 1 is a diagram schematically illustrating a method of manufacturing an inorganic oxide particle, according to an embodiment.

Reference will now be made in more detail to embodiments, examples of which are illustrated in the accompanying drawings, wherein like reference numerals refer to like elements throughout the specification, and duplicative descriptions may not be provided. In this regard, the present embodiments may have different forms and should not be construed as being limited to the descriptions set forth herein.

Accordingly, the embodiments are merely described with reference to the drawings to explain aspects of the present description. As used herein, the term "and/or" includes any and all combinations of one or more of the associated listed items. Throughout the disclosure, the expression "at least one of a, b and c" indicates only a, only b, only c, both (e.g., simultaneously) a and b, both (e.g., simultaneously) a and c, both (e.g., simultaneously) b and c, all of a, b, and c, or variations thereof.

It will be understood that although the terms "first," "second," etc. used herein may be used herein to describe various components, these components should not be limited by these terms. These components are only used to distinguish one component from another.

As used herein, singular forms such as "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list. The term "may" will be understood to refer to "one or more embodiments," some of which include the described element and some of which exclude that element and/or include an alternate element. Similarly, alternative language such as "or" refers to "one or more embodiments," each including a corresponding listed item.

It will be further understood that the terms "includes" and/or "comprises" used herein specify the presence of stated features or elements, but do not preclude the presence or addition of one or more other features or elements. Unless defined otherwise, the terms "include or have" may refer to both (e.g., simultaneously) the case of consisting of features or components described in a specification and the case of further including other components.

The term "Group II" used herein may include a Group IIA element and a Group IIB element in the IUPAC periodic table, and examples of the Group II element may include cadmium (Cd), magnesium (Mg), and zinc (Zn), but embodiments are not limited thereto.

The term "Group III" used herein may include a Group IIIA element and a Group IIIB element in the IUPAC periodic table, and examples of the Group III element may include aluminum (Al), indium (In), gallium (Ga), and thallium (Tl), but embodiments are not limited thereto.

The term "Group IV" used herein may include a Group IVA element and a Group IVB element in the IUPAC periodic table, and examples of the Group IV element may include silicon (Si), germanium (Ge), and tin (Sn), but embodiments are not limited thereto. The term "metal" used herein may include metalloid such as Si.

The term "Group V" used herein may include a Group VA element in the IUPAC periodic table, and examples of the Group V element may include nitrogen (N), phosphorus (P), arsenic (As), antimony (Sb), and bismuth (Bi), but embodiments are not limited thereto.

The term "Group VI" used herein may include a Group VIA element in the IUPAC periodic table, and examples of the Group VI element may include oxygen (O), sulfur (S), selenium (Se), and tellurium (Te), but embodiments are not limited thereto.

FIG. 1 is a diagram schematically showing a method of manufacturing an inorganic oxide particle, according to an embodiment.

Hereinafter, according to an embodiment, a method of manufacturing an inorganic oxide particle 3 including an inorganic oxide core $1a$ and a hydroxyl group $1b$ bonded to a surface of the inorganic oxide core $1a$ will be described with reference to FIG. 1.

In an embodiment, an inorganic oxide included in the inorganic oxide core $1a$ and an inorganic oxide included in an inorganic oxide core precursor 1 may be identical to each other.

In an embodiment, the inorganic oxide core $1a$ may be defined as a region other than a region of the hydroxyl group $1b$ formed due to a reaction between oxygen atoms located on a surface of the inorganic oxide core precursor 1 and protons (H$^+$) supplied by a proton supply compound 2. For example, the range of the inorganic oxide core $1a$ may span the inorganic oxide particle 3 excluding the hydroxyl group(s) $1b$.

In an embodiment, a first composition 11 including the inorganic oxide core precursor 1 and the proton supply compound 2 may be prepared.

In an embodiment, the inorganic oxide core precursor 1 may include an oxide represented by Formula 1:

$$M^1_x M^2_{1-x} O_y \quad \text{Formula 1}$$

wherein, in Formula 1,

M$^1$ and M$^2$ may each independently be zinc (Zn), magnesium (Mg), cobalt (Co), manganese (Mn), yttrium (Y), aluminum (Al), titanium (Ti), zirconium (Zr), tin (Sn), tungsten (W), tantalum (Ta), nickel (Ni), molybdenum (Mo), copper (Cu), silver (Ag), Ytterbium (Yb), Silicon (Si), or a combination thereof, $0 \leq x \leq 1$, and $0 < y \leq 5$.

In one or more embodiments, M$^1$ may include zinc (Zn), titanium (Ti), zirconium (Zr), tin (Sn), tungsten (W), tantalum (Ta), nickel (Ni), molybdenum (Mo), copper (Cu), silver (Ag), Ytterbium (Yb), Silicon (Si), or a combination thereof.

In an embodiment, M$^1$ may include Zn.

In one or more embodiments, M$^2$ may include magnesium (Mg), cobalt (Co), nickel (Ni), zirconium (Zr), manganese (Mn), tin (Sn), yttrium (Y), aluminum (Al), or a combination thereof.

In an embodiment, M$^2$ may include Mg.

In one or more embodiments, $0.5 < x \leq 1$.

In one or more embodiments, $0 < y \leq 3$.

In one or more embodiments, $0 < y \leq 1$.

In an embodiment, the inorganic oxide core precursor 1 may be ZnO, TiO$_2$, ZrO$_2$, SnO$_2$, WO$_3$, W$_2$O$_3$, WO$_2$, Ta$_2$O$_5$, NiO, MoO$_2$, MoO$_3$, CuO, Cu$_2$O, ZnMgO, ZnCoO, ZnMnO, ZnSnO, ZnYbO, ZnSiO, ZnAlO, or any combination thereof.

In an embodiment, the inorganic oxide core precursor 1 may be a zinc (Zn)-containing oxide.

In an embodiment, the inorganic oxide core precursor 1 may be ZnO, ZnMgO, ZnAlO, ZnSiO, ZnYbO, TiO$_2$, WO$_3$, WO$_2$, W$_2$O$_3$, or any combination thereof.

In an embodiment, an average particle diameter (D50) of the inorganic oxide core precursor 1 may be in a range of about 1 nm to about 30 nm. In an embodiment, the average particle diameter (D50) of the inorganic oxide core precursor 1 may be in a range of about 2 nm to about 30 nm, about 3 nm to about 30 nm, about 5 nm to about 30 nm, about 1 nm to about 25 nm, about 1 nm to about 20 nm, about 1 nm to about 15 nm, or about 5 nm to about 15 nm.

The proton supply compound 2 may include a carboxylic acid-containing compound, a peroxide-containing compound, or a combination thereof.

In an embodiment, the carboxylic acid-containing compound may be represented by Formula 2, and the peroxide-containing compound may be represented by Formula 3:

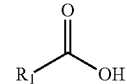

Formula 2

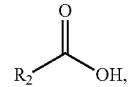

Formula 3 wherein, in Formulae 2 and 3, $R_1$ and $R_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

In an embodiment, $R_1$ and $R_2$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, —Si$(Q_{31})(Q_{32})(Q_{33})$, —N$(Q_{31})(Q_{32})$, —B$(Q_{31})(Q_{32})$, —P$(Q_{31})(Q_{32})$, —C(=O)$(Q_{31})$, —S(=O)$_2(Q_{31})$, —P(=O)$(Q_{31})(Q_{32})$, or any combination thereof; or —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, or —P(=O)$(Q_1)(Q_2)$, wherein $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, $R_1$ and $R_2$ may each independently be:

hydrogen, deuterium, —F, a cyano group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —$CD_3$, —$CD_2H$, —$CDH_2$, —$CF_3$, —$CF_2H$, —$CFH_2$, a cyano group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, or a benzosilolocarbazolyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, or any combination thereof.

In one or more embodiments, $R_1$ and $R_2$ may each independently be: hydrogen, deuterium, —F, or a cyano group; or a $C_1$-$C_{20}$ alkyl group, a vinyl group, a phenyl group, or a $C_1$-$C_{20}$ alkylphenyl group, each unsubstituted or substituted with deuterium, —F, a cyano group, a $C_1$-$C_{20}$ alkyl group, a vinyl group, a phenyl group, or a $C_1$-$C_{20}$ alkylphenyl group; or any combination thereof.

In one or more embodiments, $R_1$ and $R_2$ may each be a methyl group, an ethyl group, a propyl group, a butyl group, a pentyl group, a vinyl group, an ethylphenyl group, a propylphenyl group, a butylphenyl group, a phenylmethyl group, a phenylethyl group, a phenylpropyl group, or a phenylbutyl group.

In an embodiment, the carboxylic acid-containing compound may include propionic acid, isobutyl acid, butyric acid, 2-methylbutanoic acid, pivalic acid, valeric acid, isovaleric acid, acrylic acid, methacrylic acid, or any combination thereof.

In one or more embodiments, the carboxylic acid-containing compound may include propionic acid, isobutyl acid, isovaleric acid, methacrylic acid, or any combination thereof.

In an embodiment, the peroxide-containing compound may include methyl hydroperoxide, ethyl hydroperoxide, propyl hydroperoxide, isopropyl hydroperoxide, n-butyl hydroperoxide, sec-butyl hydroperoxide, iso-butyl hydroperoxide, tert-butyl hydroperoxide, hydroperoxy benzene, 1-ethyl-4-hydroperoxy benzene, (1-hydroperoxyethyl)benzene, 1-hydroperoxy-4-methylbenzene, cumene hydroperoxide, (2-hydroperoxypropan-2-yl)benzene, or any combination thereof.

In one or more embodiments, the peroxide-containing compound may include tert-butyl hydroperoxide, cumene hydroperoxide, (2-hydroperoxypropan-2-yl)benzene, or any combination thereof.

In an embodiment, the first composition 11 may further include a first solvent.

In an embodiment, the first solvent in the first composition 11 may include an alcohol-based solvent, a chlorine-based solvent, an ether-based solvent, an ester-based solvent, a ketone-based solvent, an aliphatic hydrocarbon-based solvent, an aromatic hydrocarbon-based solvent, or any combination thereof.

In an embodiment, the first solvent in the first composition 11 may include: an alcohol-based solvent (such as methanol, ethanol, n-propanol, iso-propanol, n-butanol, iso-butanol, sec-butanol, and/or t-butanol); a chlorine-based solvent (such as dichloromethane, 1,2-dichloroethane, 1,1,2-trichloroethane, chlorobenzene, and/or o-dichlorobenzene); an ether-based solvent (such as tetrahydrofuran, dioxane, anisole, 4-methylanisole, and/or butyl phenylether); an ester-based solvent (such as ethyl acetate, butyl acetate, methyl benzoate, ethyl benzoate, butyl benzoate, and/or phenyl benzoate); a ketone-based solvent (such as acetone, methylethylketone, cyclohexanone, and/or acetophenone); an aliphatic hydrocarbon-based solvent (such as cyclohexane, methylcyclohexane, n-pentane, n-hexane, n-heptane, n-octane, n-nonane, n-decane, dodecane, hexadecane, and/or oxadecane); an aromatic hydrocarbon-based solvent (such as toluene, xylene, mesitylene, ethylbenzene, n-hexyl benzene, cyclohexyl benzene, trimethyl benzene, tetrahydronaphthalene); or any combination thereof, but embodiments are not limited thereto.

In an embodiment, the first solvent in the first composition 11 may include an alcohol-based solvent.

In an embodiment, an amount of the proton supply compound 2 in the first composition 11 may be in a range of about 0.01 parts by weight to about 30 parts by weight based on 100 parts by weight of the inorganic oxide core precursor 1.

In an embodiment, the amount of the proton supply compound 2 in the first composition 11 may be in a range of about 0.01 parts by weight to about 15 parts by weight based on 100 parts by weight of the inorganic oxide core precursor 1.

The inorganic oxide particle 3 may be manufactured by heating the first composition 11.

In an embodiment, the heating of the first composition 11 may be performed at a temperature of about 30° C. or higher. In an embodiment, the heating of the first composition 11 may be performed at a temperature in a range of about 30° C. to about 70° C.

In an embodiment, the inorganic oxide particle 3 including the inorganic oxide core 1a and the hydroxyl group 1b bonded to the surface of the inorganic oxide core 1a may be manufactured according to the method of manufacturing an inorganic oxide particle 3 as described above.

In an embodiment, the hydroxyl group 1b bonded to the surface of the inorganic oxide core 1a may be formed via a reaction between oxygen atoms located on a surface (e.g., outer surface) of the inorganic oxide core precursor 1 and protons ($H^+$) supplied by the proton supply compound 2.

In an embodiment, the reaction between the oxygen atoms located on the surface of the inorganic oxide core precursor 1 and the protons ($H^+$) supplied by the proton supply compound 2 may be performed by the heating.

In an embodiment, the inorganic oxide particle 3 may have a round or spherical shape, for example, a substantially spherical shape.

The inorganic oxide core precursor 1 (for example, ZnO or ZnMgO) may include multiple oxygen vacancies in a crystal thereof and on a surface thereof (e.g., may include bulk and surface oxygen atom crystal vacancies). Due to the oxygen vacancy in the crystal, the inorganic oxide core precursor 1 may be an n-type (e.g., n-doped) material, and may have high electrical conductivity. A conduction band energy level of the inorganic oxide core precursor 1 may be similar to a conduction band energy level of a quantum dot. Thus, the inorganic oxide core precursor 1 may have excellent or suitable electron injection characteristics, and an inorganic oxide layer including the inorganic oxide core precursor 1 may be utilized as an electron injection layer or an electron transport layer in a quantum dot light-emitting device.

However, oxygen vacancies present on the surface of the inorganic oxide core precursor 1 may act as electron traps. Accordingly, electrons injected from an electron injection electrode may be trapped on the surface of the inorganic oxide core precursor 1. Thus, electrons may not be injected into an emission layer, and electron injection and/or transport efficiency may be reduced. In addition, defect-assisted non-radiative recombination or Auger-type non-radiative recombination may occur in a quantum dot emission layer adjacent to the inorganic oxide core precursor 1, and thus, luminescence efficiency may be reduced.

In this regard, the inorganic oxide particle 3 according to an embodiment is manufactured by preparing the first composition 11 including the inorganic oxide core precursor 1 and the proton supply compound 2, and then heating the first composition 11, so that protons released by the proton supply compound 2 can react with oxygen atoms on the surface of the inorganic oxide core precursor 1. Accordingly, the inorganic oxide particle 3 including the inorganic oxide core 1a and the hydroxyl group 1b bonded to the surface of the inorganic oxide core 1a may be manufactured. In this case, the hydroxyl group 1b may be formed at an active oxygen-absorption site present on a surface of the inorganic oxide particle 3, and thus, the number of electron trap sites (e.g., on the surface) may be reduced. Accordingly, in an inorganic oxide layer manufactured by utilizing the inorganic oxide particle 3 including the hydroxyl group 1b, the number of electron trap sites on the surface of the inorganic oxide particle 3 may be reduced, thereby improving efficiency of electron injection into an emission layer. In addition, non-radiative recombination in a quantum dot emission layer adjacent to the inorganic oxide layer may be reduced.

Accordingly, when the inorganic oxide particle 3 is utilized for manufacturing a light-emitting device, it is possible to solve or mitigate an issue in which electrical characteristics change over time when the light-emitting device is driven, by taking advantage of a chemical reaction such as oxygen adsorption in the hydroxyl group 1b of the inorganic oxide particle 3.

Because the method of manufacturing the inorganic oxide particle 3 according to an embodiment includes, as the proton supply compound 2, a carboxylic acid-containing compound, a peroxide-containing compound, or a combination thereof, the hydroxyl group 1b may be easily formed on the surface of the inorganic oxide core 1a.

Accordingly, the light-emitting device manufactured by utilizing the inorganic oxide particle 3, which is manufactured by utilizing the proton supply compound 2 including a carboxylic acid-containing compound, a peroxide-containing compound, or a combination thereof, may have excellent or suitable driving characteristics, for example, a low driving voltage, high efficiency, and/or long lifespan.

Figure 2:
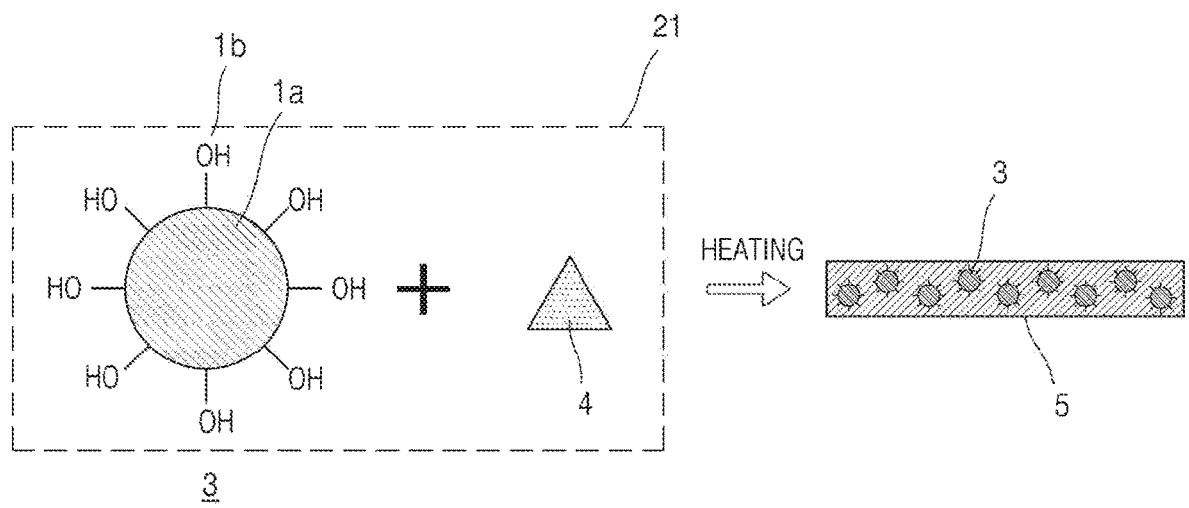
FIG. 2 is a diagram schematically illustrating a method of manufacturing an inorganic oxide layer, according to an embodiment.

FIG. 2 is a diagram schematically showing a method of manufacturing an inorganic oxide layer, according to an embodiment.

Hereinafter, according to an embodiment, a method of manufacturing an inorganic oxide layer 5 including the inorganic oxide particle 3 including the inorganic oxide core 1a and the hydroxyl group 1b bonded to the surface of the inorganic oxide core 1a will be described with reference to FIG. 2.

In an embodiment, a second composition 21 including the inorganic oxide particle 3 and a second solvent 4 may be provided on a substrate.

In an embodiment, the substrate may refer to any layer for forming the inorganic oxide layer 5. In an embodiment, the substrate may refer to any one of layers included in a light-emitting device to be described later. In an embodiment, the substrate may vary depending on the structure of a light-emitting device to which the inorganic oxide layer 5 is applied.

In an embodiment, the inorganic oxide particle 3 may be manufactured according to the method of manufacturing an inorganic oxide particle 3 as described above.

In an embodiment, the second solvent 4 in the second composition 21 may be an organic solvent.

In one or more embodiments, the second solvent 4 may include an alcohol-based solvent, a chlorine-based solvent, an ether-based solvent, an ester-based solvent, a ketone-based solvent, an aliphatic hydrocarbon-based solvent, or any combination thereof.

In one or more embodiments, the second solvent 4 may include: an alcohol-based solvent (such as methanol, ethanol, n-propanol, iso-propanol, n-butanol, iso-butanol, sec-butanol, and/or t-butanol); a chlorine-based solvent (such as dichloromethane, 1,2-dichloroethane, 1,1,2-trichloroethane, chlorobenzene, and/or o-dichlorobenzene); an ether-based solvent (such as tetrahydrofuran, dioxane, anisole, 4-methylanisole, and/or butyl phenylether); an ester-based solvent (such as ethyl acetate, butyl acetate, methyl benzoate, ethyl benzoate, butyl benzoate, and/or phenyl benzoate); a ketone-based solvent (such as acetone, methylethylketone, cyclohexanone, and/or acetophenone); an aliphatic hydrocarbon-based solvent (such as cyclohexane, methylcyclohexane, n-pentane, n-hexane, n-heptane, n-octane, n-nonane, n-decane, dodecane, hexadecane, and/or oxadecane); an aromatic hydrocarbon-based solvent (such as toluene, xylene, mesitylene, ethylbenzene, n-hexyl benzene, cyclohexyl benzene, trimethyl benzene, and/or tetrahydronaphthalene); or any combination thereof.

An amount of the second solvent 4 in the second composition 21 may be in a range of about 80 parts by weight to about 99.5 parts by weight, for example, about 90 parts by weight to about 99 parts by weight, based on 100 parts by weight of the second composition 21. Within this range, the inorganic oxide particle 3 may be substantially uniformly dispersed in the second composition 21, and thus, the inorganic oxide layer 5 having substantially uniform distribution of the inorganic oxide particle 3 may be formed.

In an embodiment, an average particle diameter (D50) of the inorganic oxide particle 3 may be in a range of about 1 nm to about 30 nm. In an embodiment, the average particle diameter (D50) of the inorganic oxide particle 3 may be in a range of about 2 nm to about 30 nm, about 3 nm to about 30 nm, about 5 nm to about 30 nm, about 1 nm to about 25 nm, about 1 nm to about 20 nm, or about 1 nm to about 15 nm.

In an embodiment, a viscosity of the second composition 21 may be in a range of about 1 cP to about 10 cP. In an embodiment, the viscosity of the second composition 21 may be in a range of about 1 cP to about 8 cP, about 1 cP to about 6 cP, about 2 cP to about 10 cP, about 4 cP to about 10 cP, or about 2 cP to about 8 cP.

In an embodiment, a surface tension of the second composition 21 may be in a range of about 10 dynes/cm to about 40 dynes/cm. In an embodiment, the surface tension of the second composition 21 may be in a range of about 10 dynes/cm to about 35 dynes/cm, about 10 dynes/cm to about 30 dynes/cm, about 10 dynes/cm to about 25 dynes/cm, about 15 dynes/cm to about 40 dynes/cm, about 20 dynes/cm to about 40 dynes/cm, or about 15 dynes/cm to about 30 dynes/cm.

In an embodiment, an amount of the inorganic oxide particle 3 in the second composition 21 may be in a range of about 0.1 parts by weight to about 20 parts by weight based on 100 parts by weight of the second solvent 4. In an embodiment, the amount of the inorganic oxide particle 3 in the second composition 21 may be in a range of about 0.1 parts by weight to about 18 parts by weight, about 0.1 parts by weight to about 16 parts by weight, about 0.1 parts by weight to about 14 parts by weight, about 0.1 parts by weight to about 12 parts by weight, about 0.1 parts by weight to about 10 parts by weight, about 1 parts by weight to about 20 parts by weight, about 2 parts by weight to about 20 parts by weight, about 4 parts by weight to about 20 parts by weight, or about 1 parts by weight to about 10 parts by weight, based on 100 parts by weight of the second solvent 4.

In an embodiment, providing of the second composition 21 on the substrate may be performed by spin coating, slot coating, dip coating, bar coating, roll coating, gravure coating, micro-gravure coating, wire coating, spray coating, inkjet printing, nozzle printing, screen printing, flexo printing, offset printing, and/or casting.

In one or more embodiments, the providing of the second composition 21 may be performed on the substrate by inkjet printing and/or spin coating.

The inorganic oxide layer 5 may be manufactured by heating the second composition 21.

In an embodiment, the heating of the second composition 21 may be performed at a temperature of 70° C. or higher. In an embodiment, the heating of the second composition 21 may be performed at a temperature in a range of about 70° C. to about 150° C.

In an embodiment, the inorganic oxide layer 5 may be formed as or when the second solvent 4 included in the second composition 21 is removed by the heating.

Hereinafter, a method of manufacturing a light-emitting device according to an embodiment will be described, the light-emitting device including: a first electrode; a second electrode facing the first electrode; and an interlayer located between the first electrode and the second electrode and including an emission layer and an inorganic oxide layer.

In an embodiment, the method of manufacturing a light-emitting device may include: forming an emission layer on a first electrode; forming, on the emission layer, an inorganic oxide layer according to the method of manufacturing an inorganic oxide layer as described above; and forming a second electrode on the inorganic oxide layer.

In an embodiment, the forming of the emission layer may include: providing, on the first electrode, a quantum dot composition including quantum dots and a solvent; and removing the solvent in the quantum dot composition.

After the quantum dot composition is provided on the first electrode, the solvent may be removed by vacuum or heat to form an emission layer.

In an embodiment, the removing of the solvent may be performed at a set or predetermined temperature, for example, at about 50° C. to about 150° C. In an embodiment, heating may be performed under vacuum.

The quantum dot composition may be provided on the first electrode to a thickness of about 10 nm to about 100 nm.

In an embodiment, the inorganic oxide layer may be manufactured according to the method of manufacturing an inorganic oxide layer as described above.

In an embodiment, a thickness of the inorganic oxide layer may be in a range of about 5 nm to about 100 nm. In an embodiment, the thickness of the inorganic oxide layer may be in a range of about 10 nm to about 100 nm, about 20 nm to about 100 nm, about 30 nm to about 100 nm, about 10 nm to about 30 nm, about 10 nm to about 50 nm, or about 10 nm to about 80 nm.

In an embodiment, the second electrode may be formed and then heated.

In an embodiment, the heating of the second electrode may be performed at a temperature in a range of about 50° C. to about 150° C. By further heating the light-emitting device, additional hydroxy group(s) (—OH) may be generated on a surface of an inorganic oxide core. In an embodiment, the heating may be performed for about 10 hours to about 100 hours, for example, 20 hours to 80 hours, or 40 hours to 60 hours.

Hereinafter, a light-emitting device including: a first electrode; a second electrode facing the first electrode; and an interlayer located between the first electrode and the second electrode and including an emission layer and an inorganic oxide layer will be described.

In an embodiment, the light-emitting device may include: a first electrode; a second electrode facing the first electrode; an emission layer located between the first electrode and the second electrode; and an inorganic oxide layer located between the emission layer and the second electrode.

In one or more embodiments, the inorganic oxide layer may be located between the emission layer and the second electrode, and the inorganic oxide layer and the emission layer may be in direct contact with each other.

In one or more embodiments, the inorganic oxide layer may include a first inorganic oxide layer located between the emission layer and the second electrode, and a second inorganic oxide layer located between the emission layer and the first electrode. In an embodiment, the first inorganic oxide layer and the emission layer may be in direct contact with each other. In an embodiment, the second inorganic oxide layer and the emission layer may be in direct contact with each other.

In one or more embodiments, the emission layer may include a quantum dot.

The term "quantum dot" as used herein refers to a crystal of a semiconductor compound, and may include any material capable of emitting light of various emission wavelengths according to the size of the crystal.

The quantum dot in the emission layer may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound (such as CdSe, CdTe, ZnS, ZnSe, ZnTe, ZnO, HgS, HgSe, HgTe, MgSe, and/or MgS); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS); a quaternary compound (such as CdZnSeS, CdZnSeTe, CdZnSTe, CdHgSeS, CdHgSeTe, CdHgSTe, HgZnSeS, HgZnSeTe, and/or HgZnSTe); or any combination thereof.

Examples of the Group III-V semiconductor compound may include: a binary compound (such as GaN, GaP, GaAs, GaSb, AlN, AlP, AlAs, AlSb, InN, InP, InAs, and/or InSb); a ternary compound (such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb); a quaternary compound (such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb); or any combination thereof. In some embodiments, the Group III-V semiconductor compound may further include a Group II element. Examples of the Group III-V semiconductor compound further including the Group II element may include InZnP, InGaZnP, InAlZnP, and/or the like.

Examples of the Group III-VI semiconductor compound may include: a binary compound (such as GaS, GaSe, $Ga_2Se_3$, GaTe, InS, InSe, $In_2S_3$, $In_2Se_3$, and/or InTe); a ternary compound (such as $InGaS_3$, and/or $InGaSe_3$); or any combination thereof.

Examples of the Group I-III-VI semiconductor compound may include: a ternary compound, (such as AgInS, $AgInS_2$, CuInS, $CuInS_2$, $CuGaO_2$, $AgGaO_2$, and/or $AgAlO_2$); or any combination thereof.

Examples of the Group IV-VI semiconductor compound may include: a binary compound (such as SnS, SnSe, SnTe, PbS, PbSe, PbTe, and/or the like); a ternary compound (such as SnSeS, SnSeTe, SnSTe, PbSeS, PbSeTe, PbSTe, SnPbS, SnPbSe, SnPbTe, and/or the like); a quaternary compound (such as SnPbSSe, SnPbSeTe, SnPbSTe, and/or the like); or any combination thereof.

The Group IV element or compound may include: a single element compound (such as Si and/or Ge); a binary compound (such as SiC and/or SiGe); or any combination thereof.

Each element included in a multi-element compound (such as the binary compound, the ternary compound, and/or the quaternary compound) may be present at a substantially uniform concentration or non-uniform concentration in a particle.

In some embodiments, the quantum dot may have a single structure in which the concentration of each element in the quantum dot is substantially uniform, or a core-shell dual structure. In an embodiment, the material contained in the core and the material contained in the shell may be different from each other.

In an embodiment, the core may include at least one of Zn, Te, Se, Cd, In, and P. In an embodiment, the core may include InP, InZnP, ZnSe, ZnTeS, ZnSeTe, or any combination thereof.

The shell of the quantum dot may act as a protective layer to prevent or reduce chemical degeneration of the core to maintain semiconductor characteristics, and/or may act as a charging layer to impart electrophoretic characteristics to the quantum dot. The shell may be a single layer shell or a multi-layer shell. The interface between the core and the shell may have a concentration gradient in which the concentration of an element existing in the shell decreases toward the center of the core.

Examples of the shell of the quantum dot may be or include an oxide of metal, metalloid, or non-metal, a semiconductor compound, or a combination thereof.

Examples of the oxides of metal, metalloid, or non-metal may include: a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO); a ternary compound, (such as $MgAl_2O_4$, $CoFe_2O_4$, $NiFe_2O_4$, and/or $CoMn_2O_4$); or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. In an embodiment, the semiconductor compound may include CdS, CdSe, CdTe, ZnS, ZnSe, ZnTe, ZnSeS, ZnTeS, ZnSeTe, GaAs, GaP, GaSb, HgS, HgSe, HgTe, InAs, InP, InGaP, InSb, AlAs, AlP, AlSb, or any combination thereof.

In an embodiment, the shell may have a composition different from the composition of the core, and the shell may include ZnS, ZnSe, ZnSeS, ZnTeS, ZnSeTe, or any combination thereof.

The quantum dot may have a spectral full width at half maximum (FWHM) emission wavelength of about 45 nm or less, about 40 nm or less, or about 30 nm or less. When the FWHM of the quantum dot is within this range, color purity or color reproducibility may be improved. Because light emitted by the quantum dot is emitted in all directions, an optical viewing angle may be improved.

In an embodiment, a diameter of the quantum dot may be in a range of about 1 nm to about 20 nm. When the diameter of the quantum dots is within this range, specific behavior as quantum dots may be achieved (e.g., quantum dot properties and behavior may be attained), and excellent or suitable dispersibility of a composition may be obtained. In some embodiments, the quantum dot may be or include a spherical, pyramidal, multi-arm, and/or cubic nanoparticle, nanotube, nanowire, nanofiber, and/or nanoplate particle.

Because the energy band gap may be adjusted by controlling the size of the quantum dot, light having one or more suitable wavelength bands may be obtained from the quantum dot emission layer (e.g., by selecting the size(s) of the quantum dot(s) in the emission layer). Accordingly, by utilizing quantum dots of different sizes, a light-emitting device that emits light of one or more suitable wavelengths may be implemented. For example, the size of the quantum dot may be selected to emit red, green and/or blue light. In some embodiments, the size of the quantum dot may be configured to emit white light by combining light of various colors.

The quantum dot may be synthesized by a wet chemical process, a metal organic chemical vapor deposition process, a molecular beam epitaxy process, or any process similar thereto.

The wet chemical process is a method that includes mixing a precursor material with an organic solvent and then growing a quantum dot particle crystal. The organic solvent naturally acts as a dispersant coordinated on the surface of the quantum dot particle crystal and thereby controls the growth of the quantum dot particle crystal in a process that is cheaper and easier than vapor deposition methods (such as metal organic chemical vapor deposition (MOCVD) and/or molecular beam epitaxy (MBE)).

The emission layer may include a monolayer of quantum dots. In an embodiment, the emission layer may include about 2 layers to about 20 layers of quantum dots.

A thickness of the emission layer may be in a range of about 5 nm to about 200 nm, about 10 nm to about 150 nm, or for example, about 10 nm to about 100 nm.

In an embodiment, the inorganic oxide layer may be manufactured according to the method of manufacturing an inorganic oxide layer as described above.

In an embodiment, provided is a light-emitting device including: a first electrode; a second electrode facing the first electrode; and an interlayer located between the first electrode and the second electrode and including an emission layer and an inorganic oxide layer, wherein the inorganic oxide layer is manufactured according to the method of manufacturing an inorganic oxide layer as described above.

In an embodiment, a thickness of the inorganic oxide layer may be in a range of about 5 nm to about 200 nm. In an embodiment, the thickness of the inorganic oxide layer may be in a range of about 5 nm to about 180 nm, about 5 nm to about 160 nm, about 5 nm to about 140 nm, about 5 nm to about 120 nm, about 5 nm to about 100 nm, about 10 nm to about 200 nm, about 20 nm to about 200 nm, about 30 nm to about 200 nm, about 50 nm to about 200 nm, or about 20 nm to about 150 nm.

In an embodiment, the light-emitting device may further include a hole transport region located between the first electrode and the emission layer and an electron transport region located between the emission layer and the second electrode, and the electron transport region may include the inorganic oxide layer.

In an embodiment, the interlayer of the light-emitting device may include the hole transport region (e.g., located between the first electrode and the emission layer) and the electron transport region (e.g., located between the emission layer and the second electrode), and the electron transport region may include the inorganic oxide layer.

The electron transport region may include at least one layer of a buffer layer, a hole blocking layer, an electron control layer, an electron transport layer, and an electron injection layer. In this case, the inorganic oxide layer may include at least one selected from the buffer layer, the hole blocking layer, the electron control layer, the electron transport layer, and the electron injection layer (e.g., at least one of the buffer layer, the hole blocking layer, the electron control layer, the electron transport layer, and the electron injection layer may be the (an) inorganic oxide layer).

In one or more embodiments, the electron transport region may include the electron transport layer, and the inorganic oxide layer may be the electron transport layer (e.g., the electron transport layer may be the (an) inorganic oxide layer).

In one or more embodiments, the electron transport region may include the electron injection layer, and the inorganic oxide layer may be the electron injection layer (e.g., the electron injection layer may be the (an) inorganic oxide layer).

In an embodiment, the first electrode may be an anode, and the second electrode may be a cathode.

Because the inorganic oxide particle(s) included in the inorganic oxide layer includes a hydroxyl group(s) on a surface thereof, in a light-emitting device including the inorganic oxide layer, electron injection efficiency into an emission layer may be increased, and non-radiative recombination in a quantum dot emission layer adjacent to the inorganic oxide layer may be reduced. Accordingly, the light-emitting device may have excellent or suitable driving characteristics, for example, a low driving voltage, high efficiency, and/or long lifespan.

Figure 3:
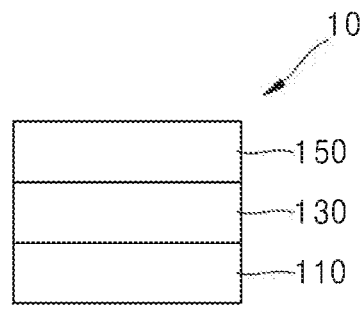
FIG. 3 is a diagram schematically illustrating the structure of a light-emitting device according to an embodiment.

Description for FIG. 3

FIG. 3 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 3.

First Electrode 110

In FIG. 3, a substrate may be additionally located under the first electrode 110 and/or above the second electrode 150. As the substrate, a glass substrate and/or a plastic substrate may be utilized. In one or more embodiments, the substrate may be a flexible substrate, and may include plastics with excellent or suitable heat resistance and/or durability (such as polyimide, polyethylene terephthalate (PET), polycarbonate, polyethylene naphthalate, polyarylate (PAR), polyetherimide, or any combination thereof).

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. In an embodiment, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region located between the first electrode 110 and the emission layer, and an electron transport region located between the emission layer and the second electrode 150.

The interlayer 130 may further include metal-containing compounds (such as organometallic compounds), inorganic materials (such as quantum dots), and/or the like, in addition to various organic materials.

In one or more embodiments, the interlayer 130 may include, i) two or more emitting units sequentially stacked between the first electrode 110 and the second electrode 150, and ii) a charge generation layer located between the two or more emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the constituting layers of each structure are sequentially stacked from the first electrode 110.

The hole transport region may include a compound represented by Formula 201, a compound represented by Formula 202, or any combination thereof:

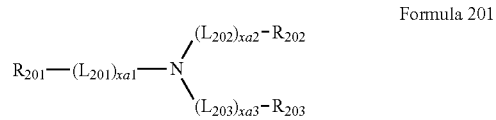

Formula 201

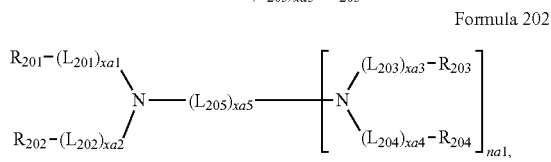

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group and/or the like) unsubstituted or substituted with at least one $R_{10a}$ (for example, see Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

For example, each of Formulae 201 and 202 may include at least one of the groups represented by Formulae CY201 to CY217:

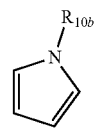

CY201

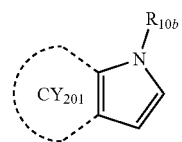

CY202

CY203 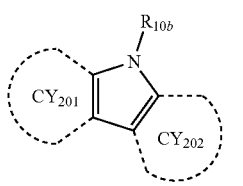

CY204 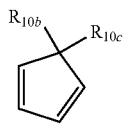

CY205 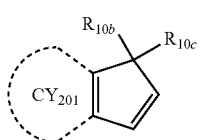

CY206 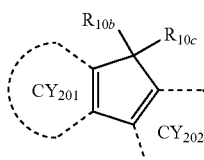

CY207 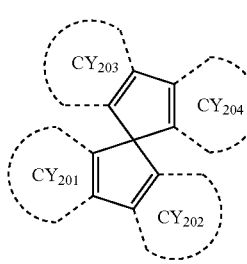

CY208 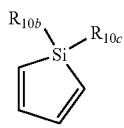

CY209 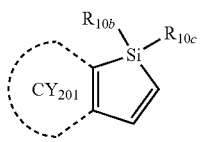

CY210 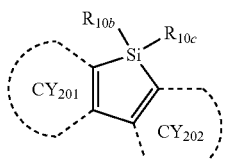

CY211 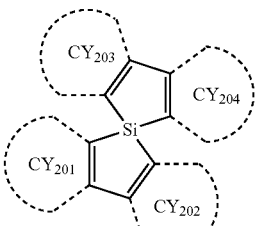

CY212 

CY213 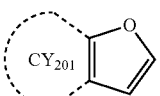

CY214 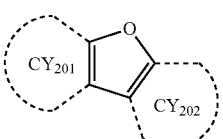

CY215 

CY216 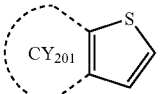

CY217 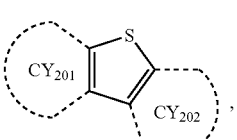

wherein, in Formulae CY201 to CY217, $R_{10b}$ and $R_{10c}$ are each the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring CY201 to ring CY204 in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include (e.g., may exclude) a group represented by one of Formulae CY201 to CY203.

In one or more embodiments, each of Formulae 201 and 202 may not include (e.g., may exclude) a group represented by one of Formulae CY201 to CY203, and may include at least one of the groups represented by Formulae CY204 to CY217.

In one or more embodiments, each of Formulae 201 and 202 may not include (e.g., may exclude) a group represented by one of Formulae CY201 to CY217.

In an embodiment, the hole transport region may include one of Compounds HT1 to HT46, m-MTDATA, TDATA, 2-TNATA, NPB(NPD), p-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA) and polyaniline/poly(4-styrene sulfonate) (PANI/PSS), or any combination thereof:

HT1

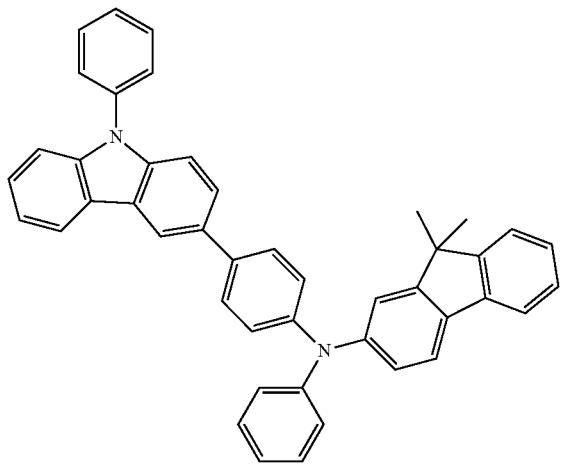

HT2

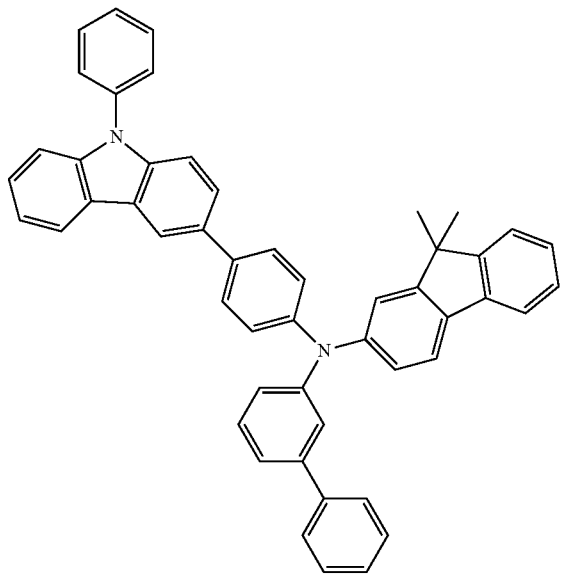

HT3

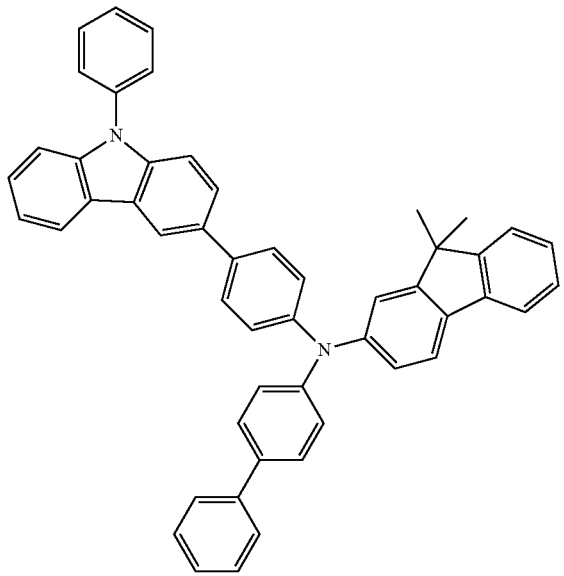

HT4

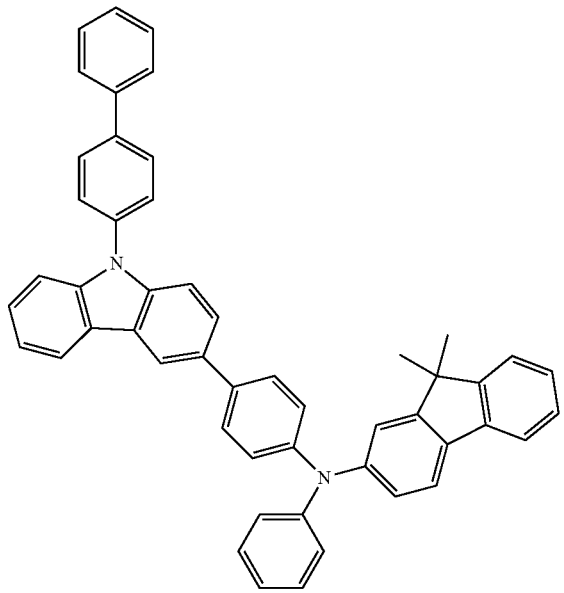

-continued
HT5 HT6
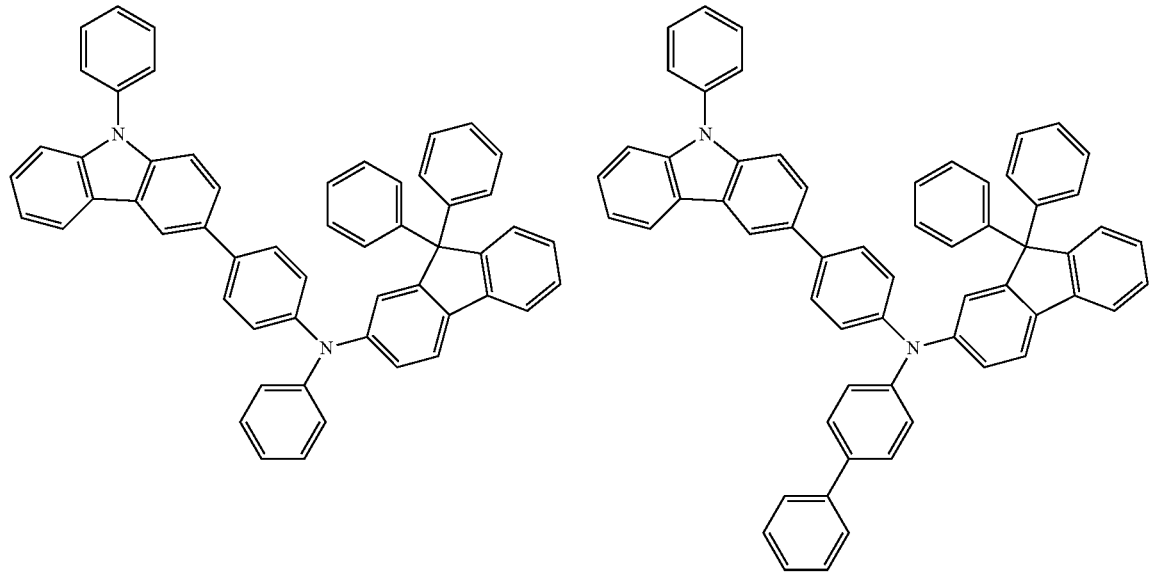
HT7 HT8
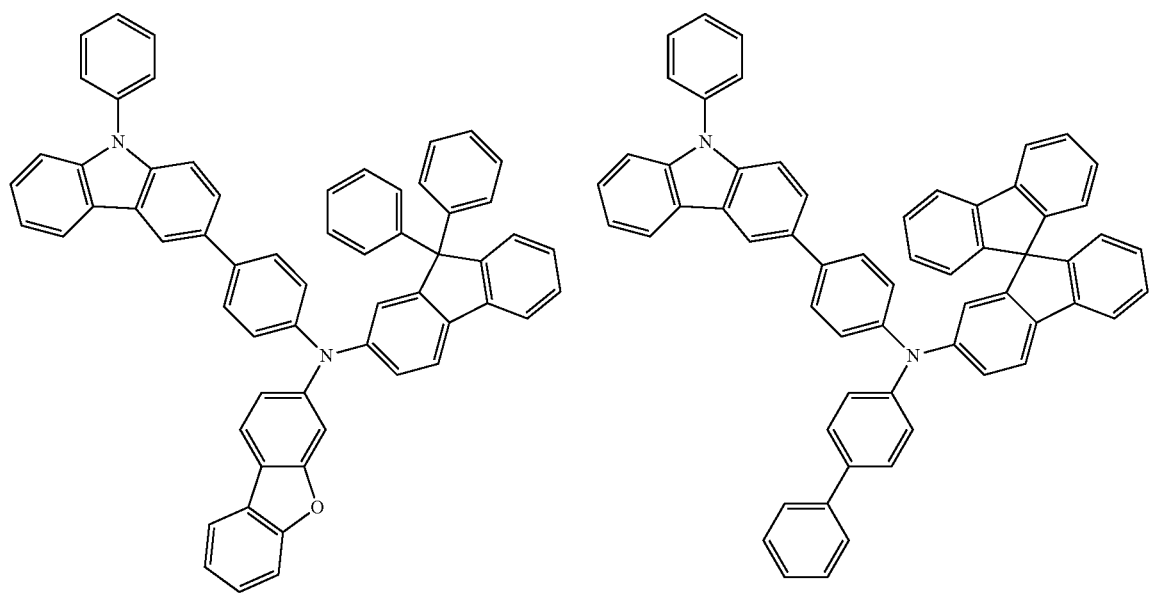

-continued
HT9
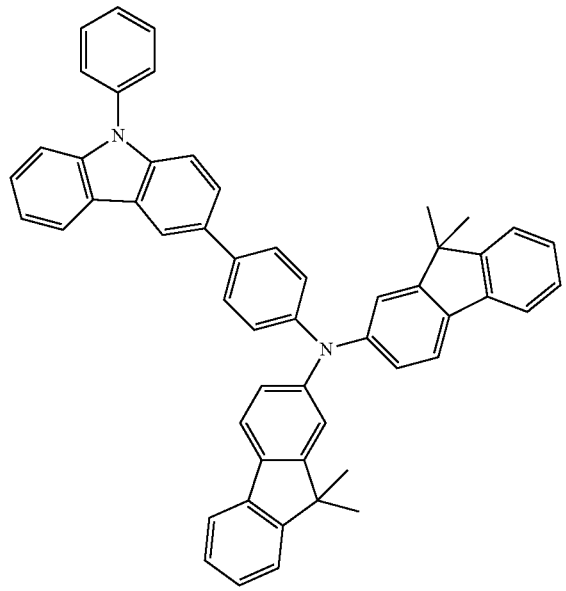
HT10
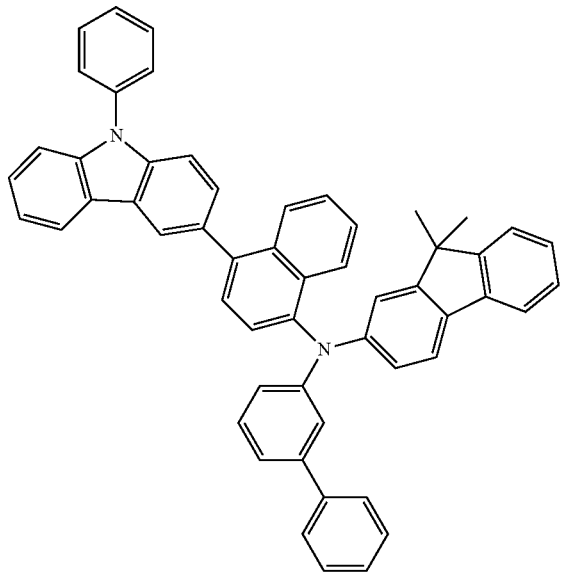
HT11
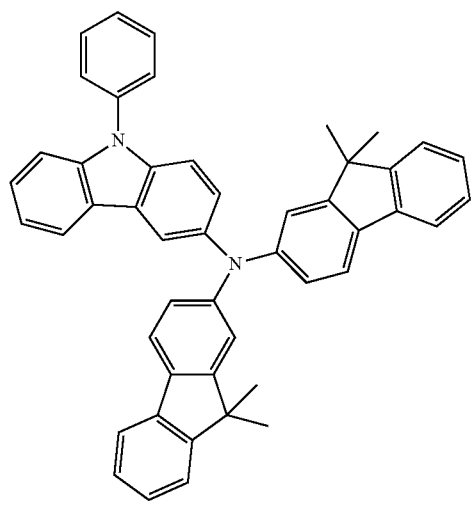
HT12
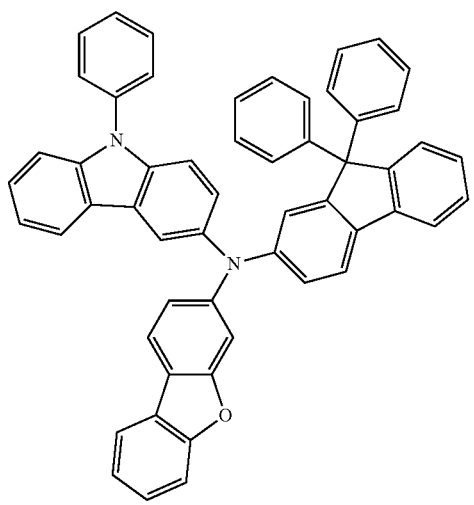

-continued
HT13
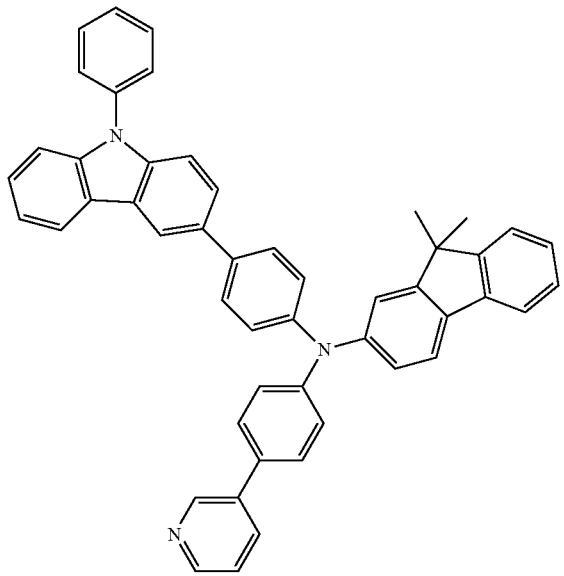
HT14
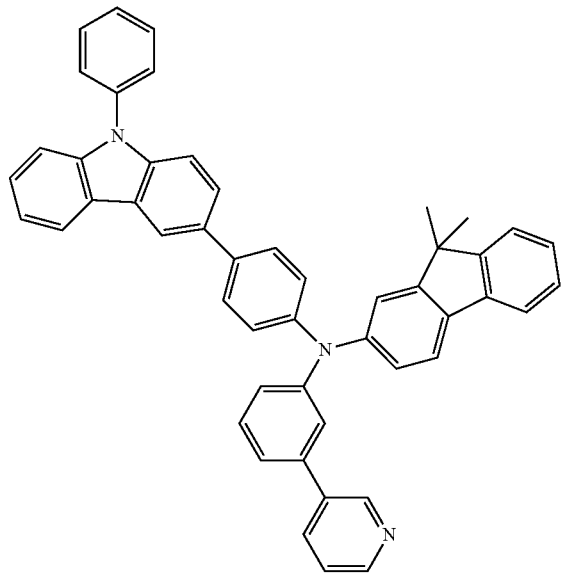
HT15
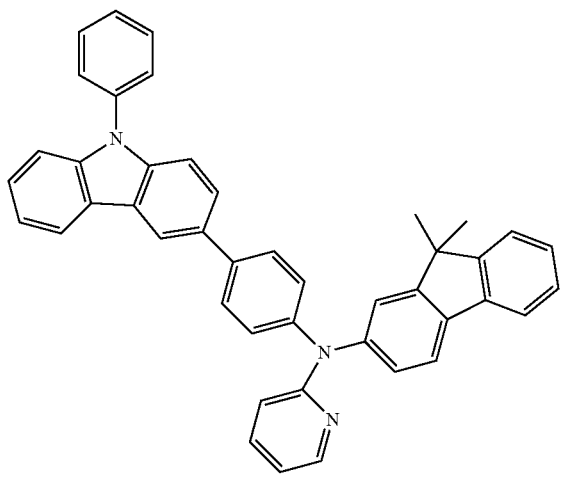
HT16
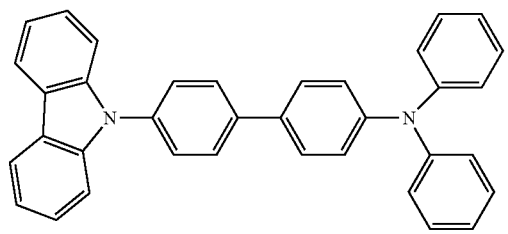
HT17
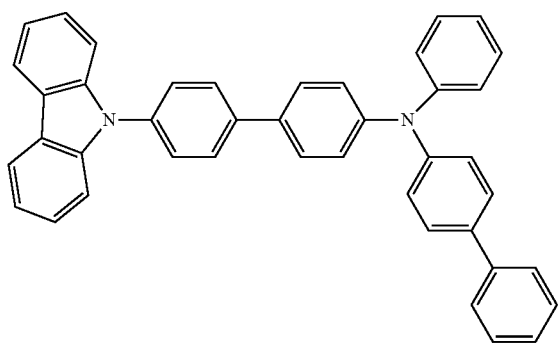
HT18
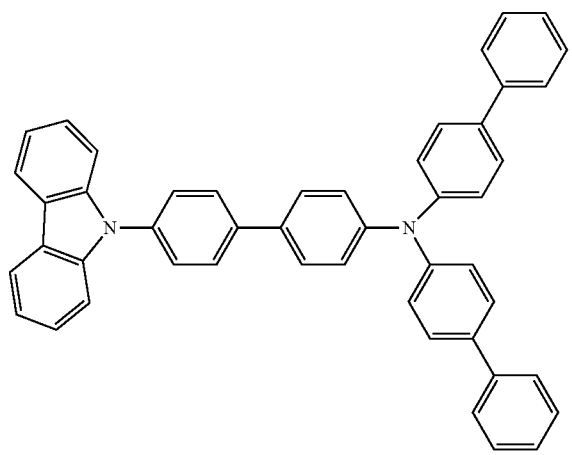

-continued
HT19
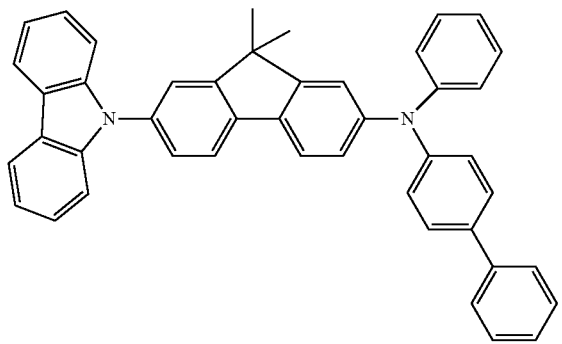
HT20
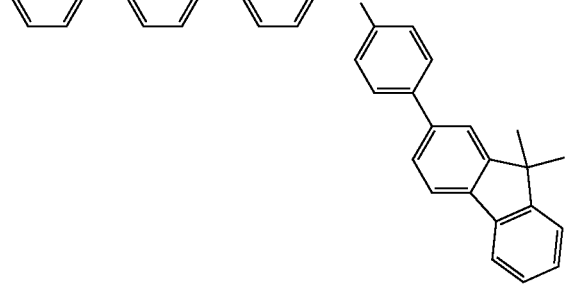
HT21
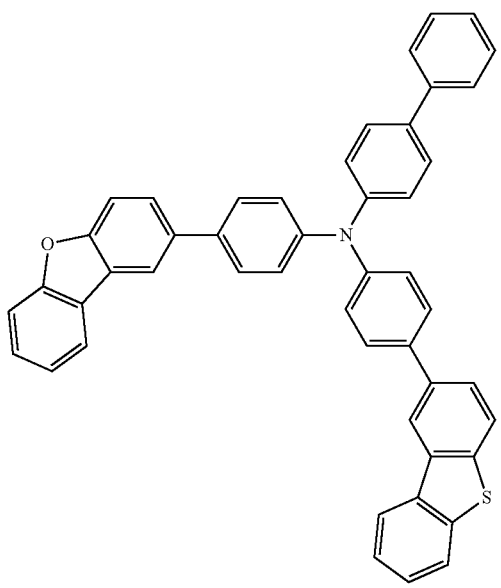
HT22
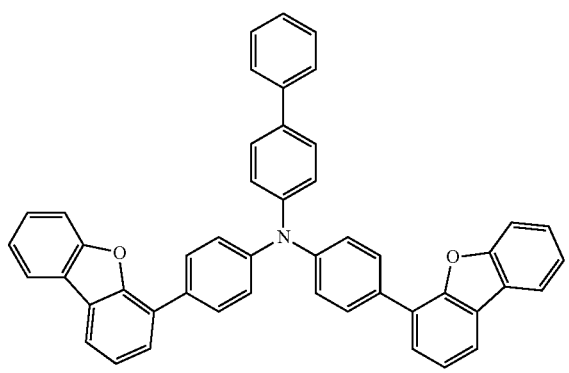

HT23
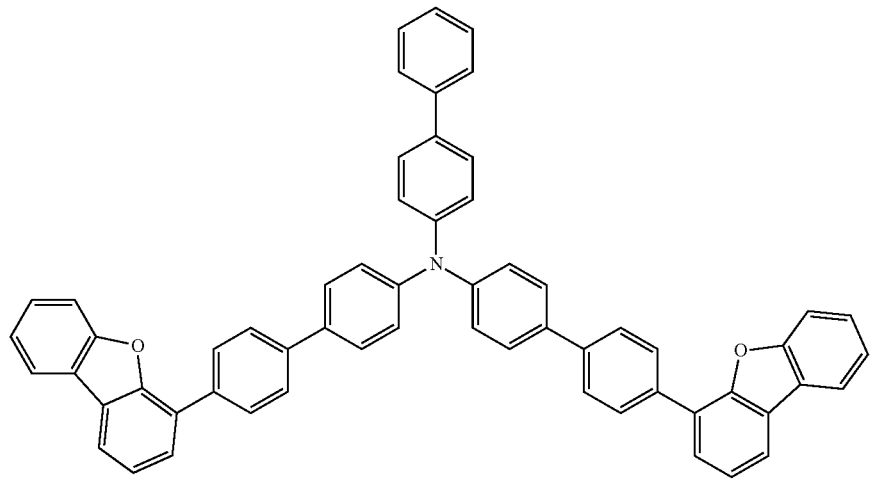
HT24
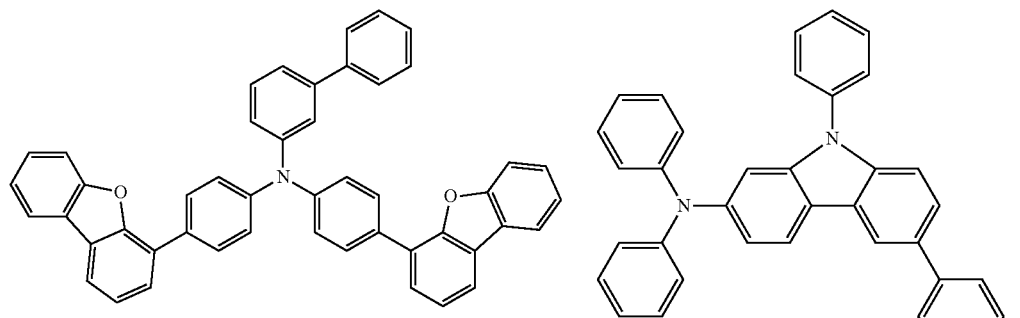
HT25
HT26
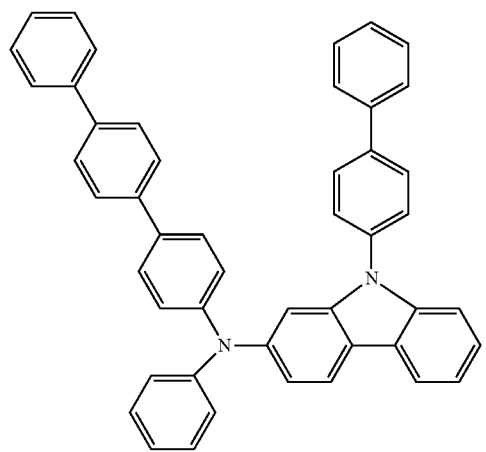
HT27
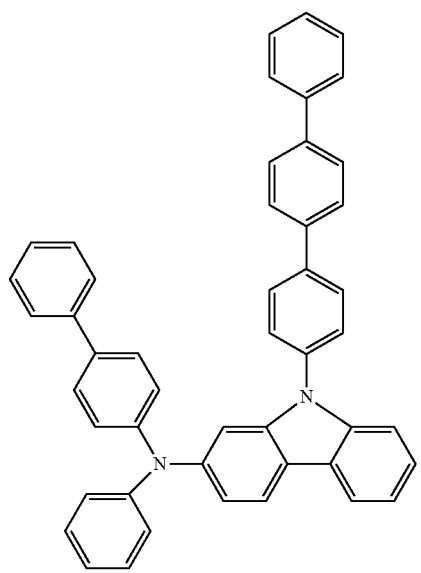

-continued
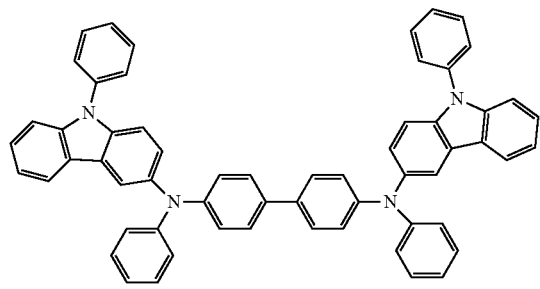
HT28
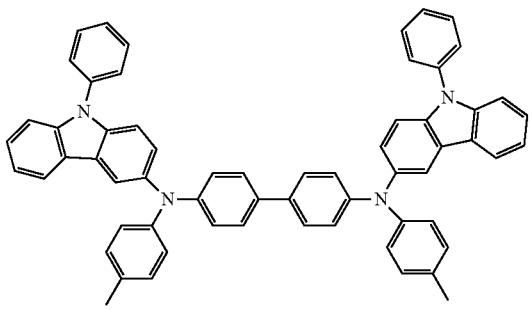
HT29
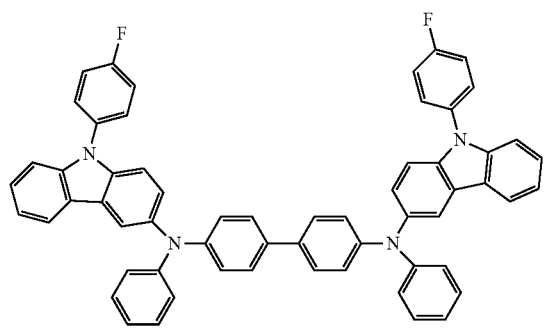
HT30
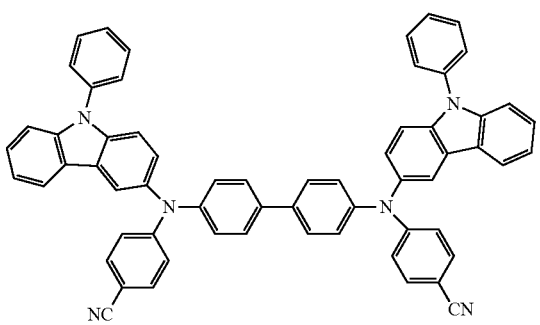
HT31
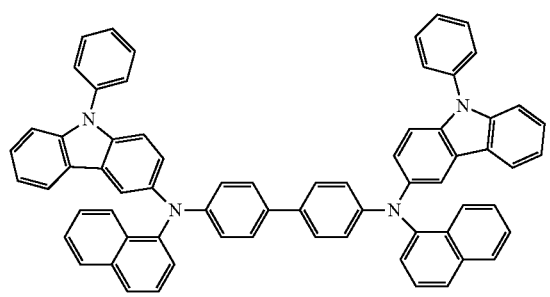
HT32
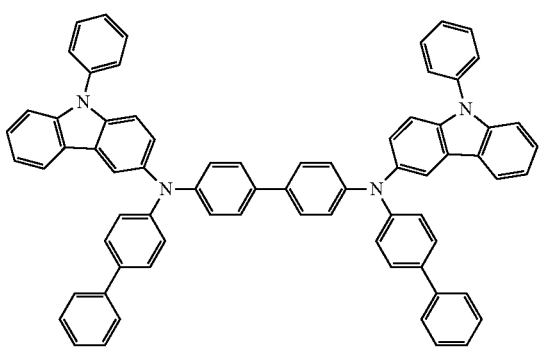
HT33
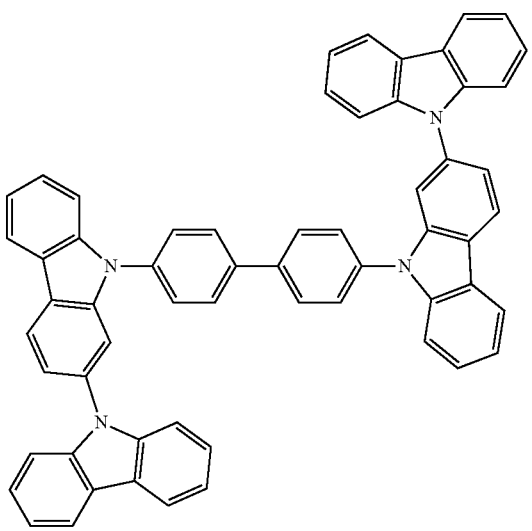
HT35
HT34

-continued
HT36
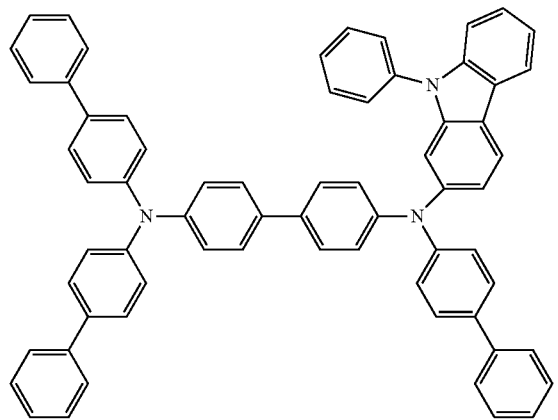
HT37
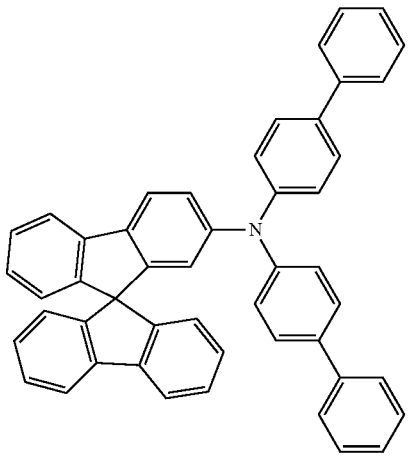
HT38
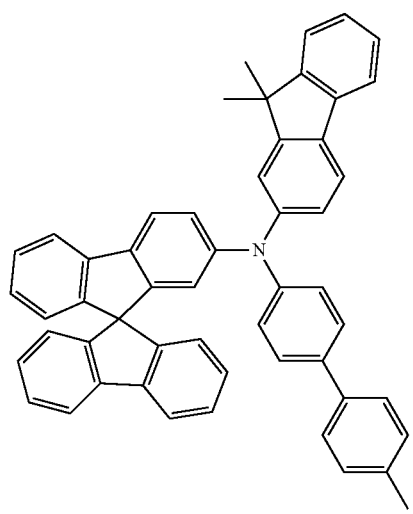
HT39
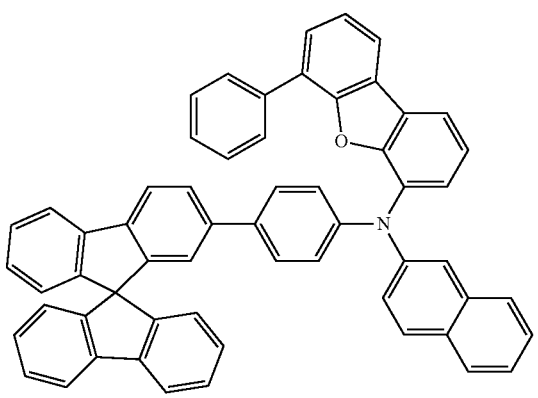
HT40
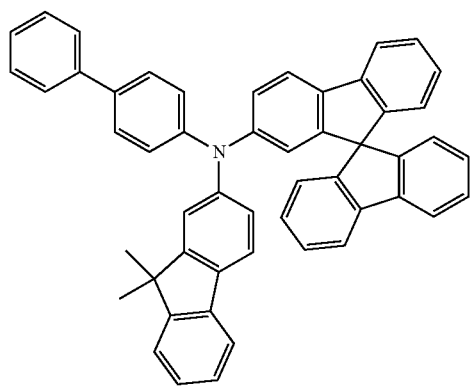
HT41
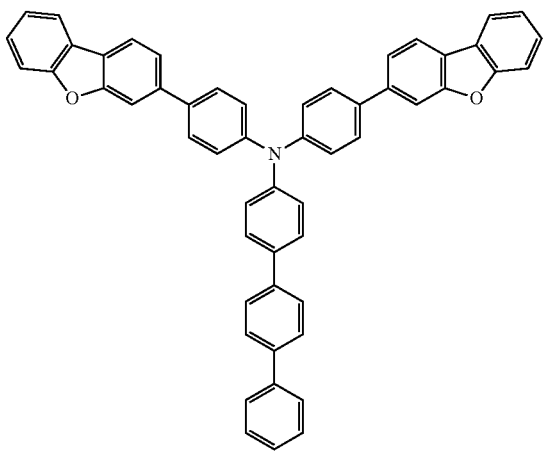

HT42
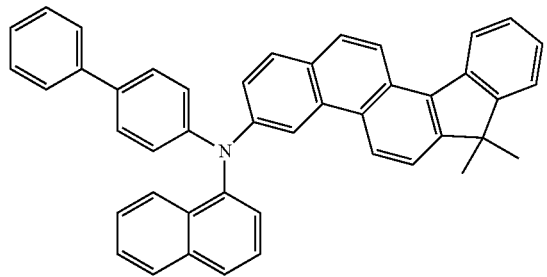
HT43
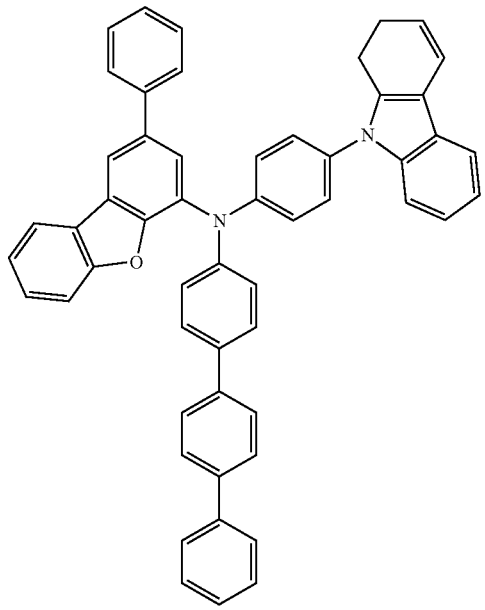
HT44
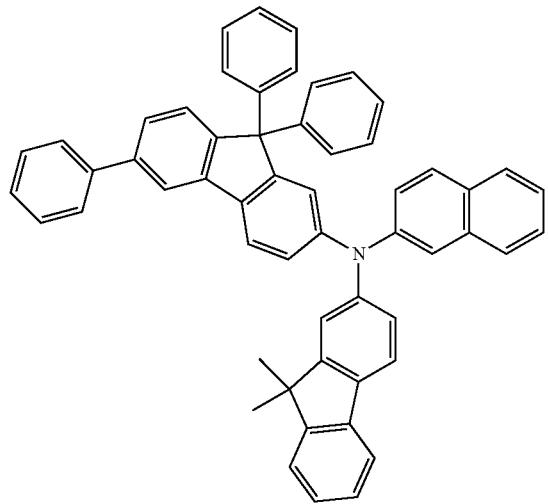
HT45
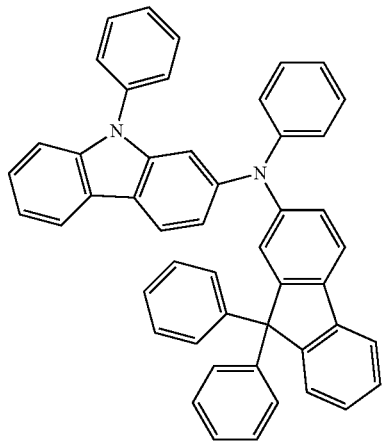

-continued
HT46
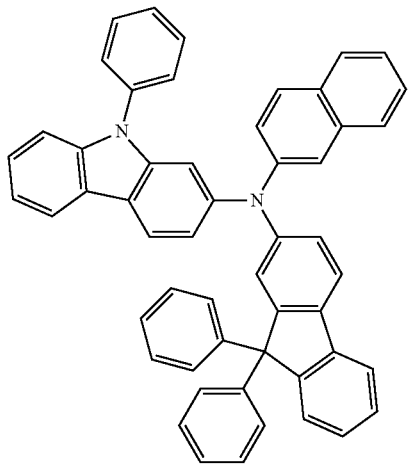
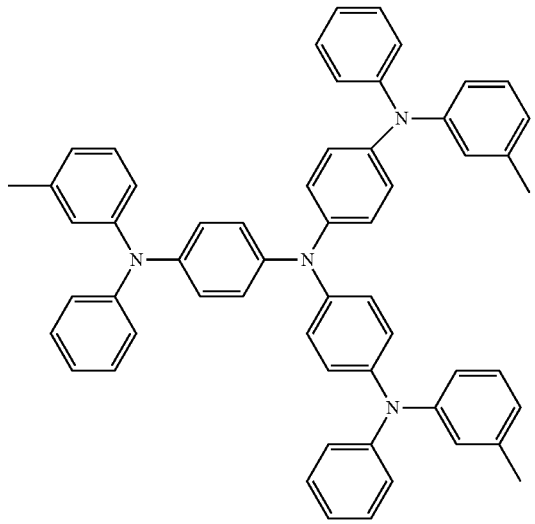
m-MTDATA
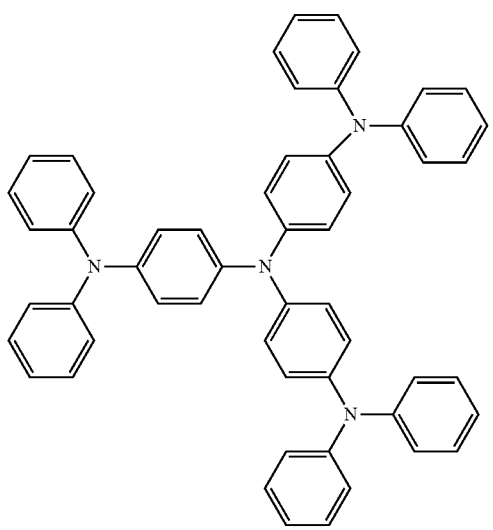
TDATA
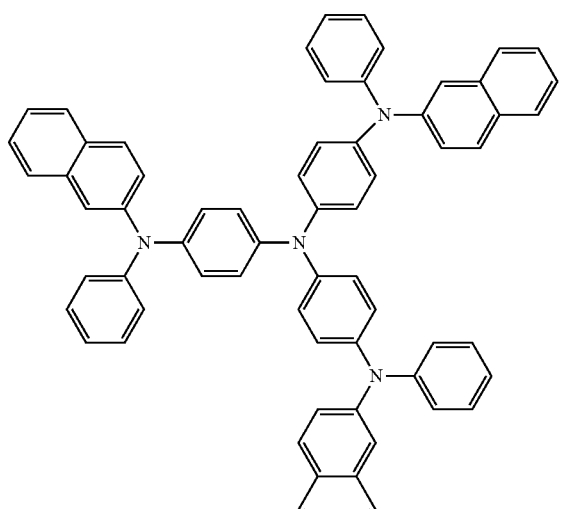
2-TNATA
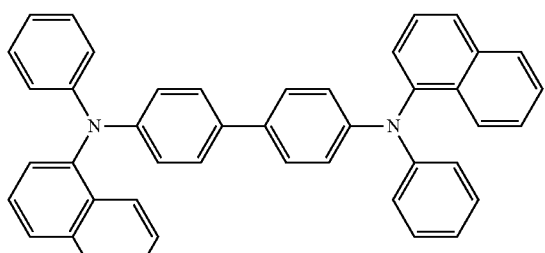
NPB
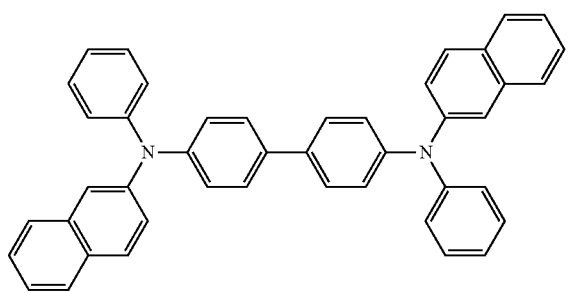
β-NPB -continued

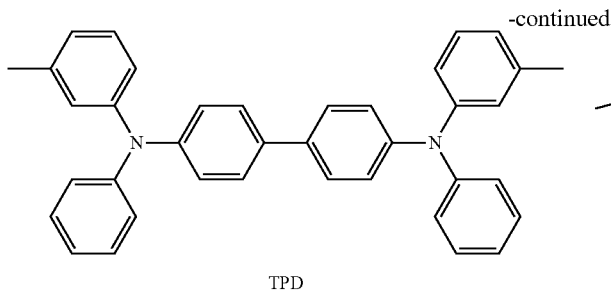
TPD

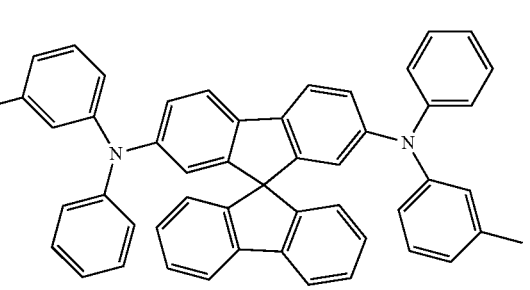
Spiro-TPD

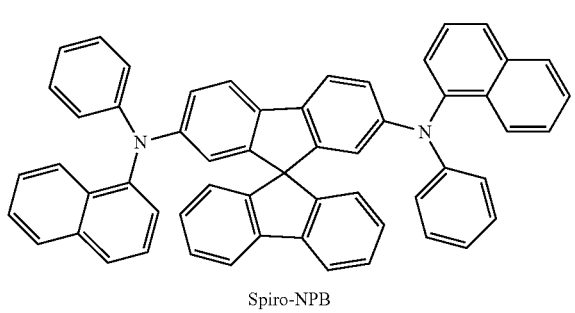
Spiro-NPB

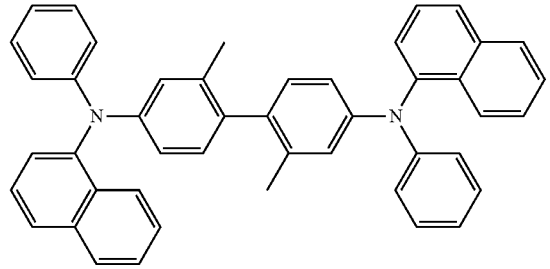
methylated-NPB

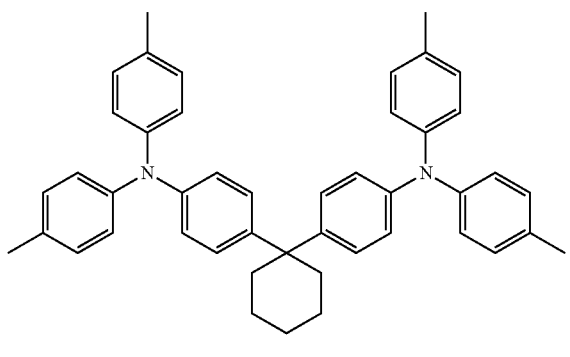
TAPC

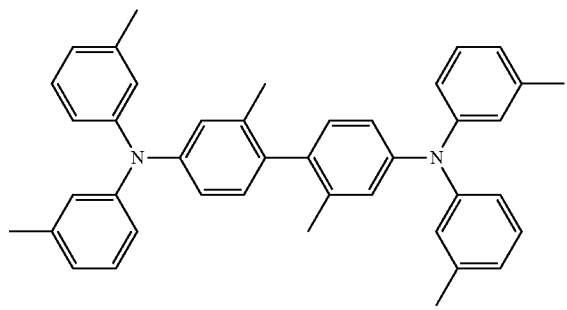
HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron-blocking layer may block or reduce the leakage of electrons from an emission layer to a hole transport region. Materials that may be included in the hole transport region may be included in the emission auxiliary layer and/or the electron-blocking layer.

p-dopant

The hole transport region may further include, in addition to these materials, a charge-generation material for the improvement of conductive properties. The charge-generation material may be substantially uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be −3.5 eV or less.

In one or more embodiments, the p-dopant may include a quinone derivative, a cyano group-containing compound, a compound containing an element EL1 and an element EL2, or any combination thereof.

Examples of the quinone derivative may include TCNQ, F4-TCNQ, and/or the like.

Examples of the cyano group-containing compound may include HAT-CN, a compound represented by Formula 221, and/or the like:

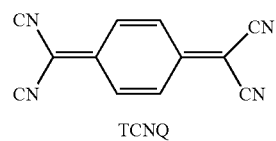
TCNQ

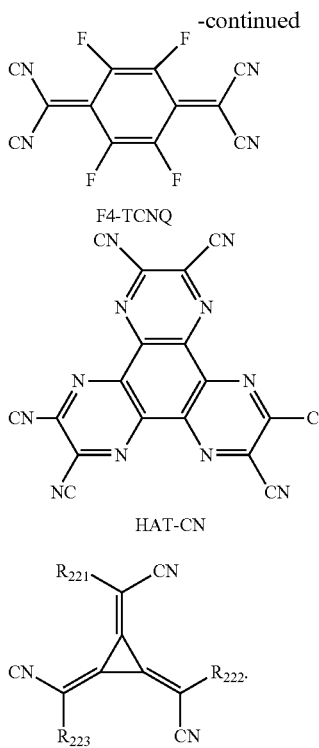

F4-TCNQ

HAT-CN

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including the element EL1 and the element EL2, the element EL1 may be a metal, a metalloid, or any combination thereof, and the element EL2 may be a non-metal, a metalloid, or any combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and/or a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and/or tellurium (Te).

Examples of the non-metal may include oxygen (O) and halogen (for example, F, Cl, Br, I, etc.).

For example, the compound containing the element EL1 and the element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and/or a rhenium oxide (for example, $ReO_3$, etc.).

Examples of the metal halide may include an alkali metal halide, an alkaline earth metal halide, a transition metal halide, a post-transition metal halide, and/or a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an ferrous halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a cuproushalide (for example, CuF, CuCl, CuBr, CuI, etc.), a silver halide (for example, AgF, AgCl, AgBr, AgI, etc.), and/or a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and/or a tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and/or $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and/or a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. At least one of the emission layers may include the quantum dot described above. In an embodiment, the green emission layer may be a quantum dot emission layer including the quantum dot, and the blue emission layer and the red emission layer may each be an organic emission layer, each including an organic compound.

In one or more embodiments, the emission layer may have a structure in which at least two of a red emission layer, a green emission layer, and a blue emission layer may contact each other or may be separated from each other. At least one emission layer of the at least two emission layers may be a quantum dot emission layer including the quantum dots, and the other emission layer may be an organic emission layer including organic compounds. Additional embodiments of the present disclosure include various other combinations of emission layer colors and compositions.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include the inorganic oxide layer described above.

In one or more embodiments, the electron transport region may include, for example, ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, $PC_{61}BM$, $PC_{71}BM$, ZnMgO, AZO, GZO, IZO, Al-doped $TiO_2$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or any combination thereof.

The electron transport region may include a buffer layer, a hole blocking layer, an electron control layer, an electron transport layer, an electron injection layer, or any combination thereof. In this regard, the buffer layer, the hole blocking layer, the electron control layer, the electron transport layer, or the electron injection layer may each be the inorganic oxide layer (e.g., may each be an inorganic oxide layer or may be integrated as one inorganic oxide layer), or any combination of at least one of the buffer layer, the hole blocking layer, the electron control layer, and the electron transport layer may be the inorganic oxide layer.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituting layers of each structure are sequentially stacked from the emission layer.

The electron transport region (for example, the buffer layer, the hole blocking layer, the electron control layer, or the electron transport layer in the electron transport region) may include the metal oxide described above.

The electron transport region (for example, the buffer layer, the hole blocking layer, the electron control layer, or the electron transport layer in the electron transport region) may further include an organic material. In an embodiment, the electron transport region may include a metal-free compound including at least one π electron-depleted nitrogen-containing $C_1$-$C_{60}$ cyclic group.

In an embodiment, the electron transport region may include a compound represented by Formula 601:

Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

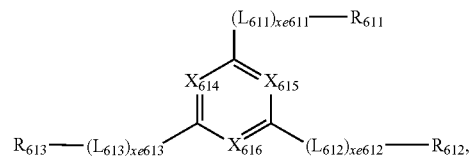

Formula 601-1 wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ and NTAZ, or any combination thereof:

ET1

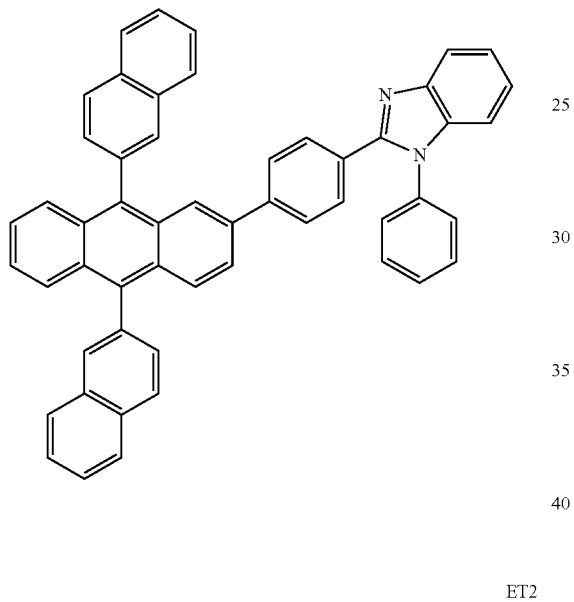

ET2

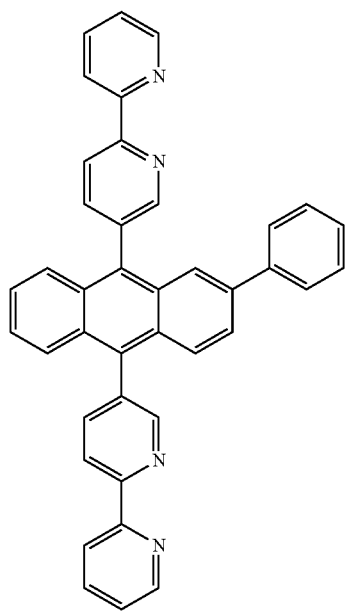

ET3

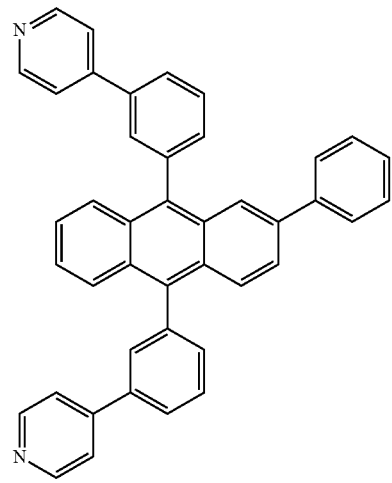

ET4

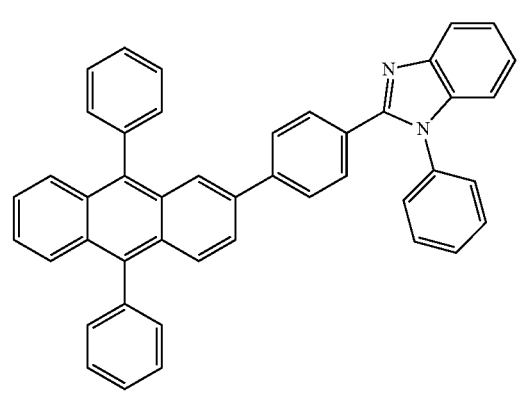

ET5

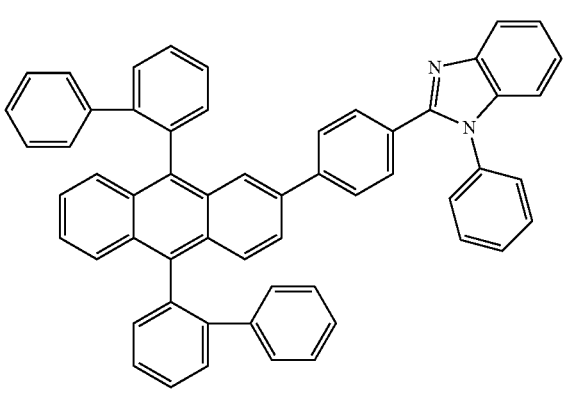

ET6
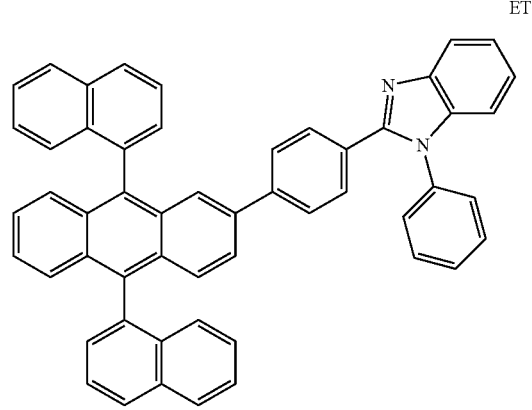
ET7
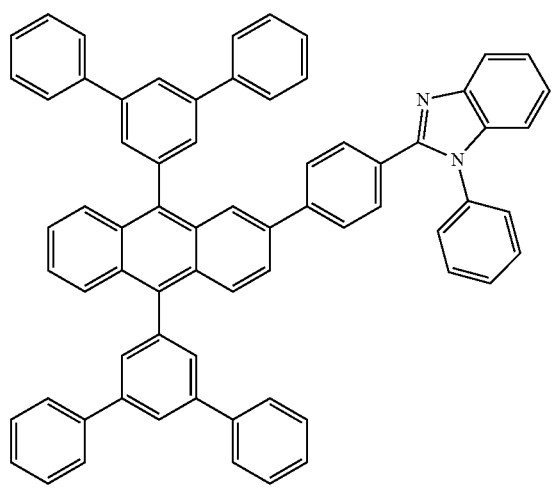
ET9
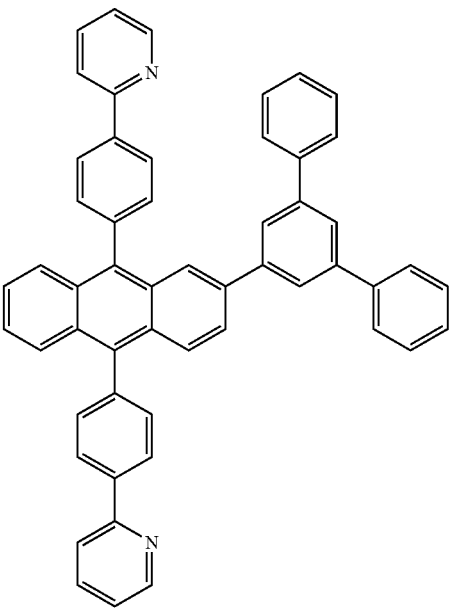
ET10
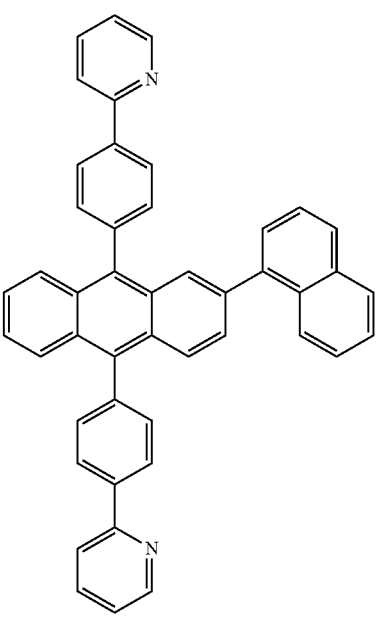

ET11
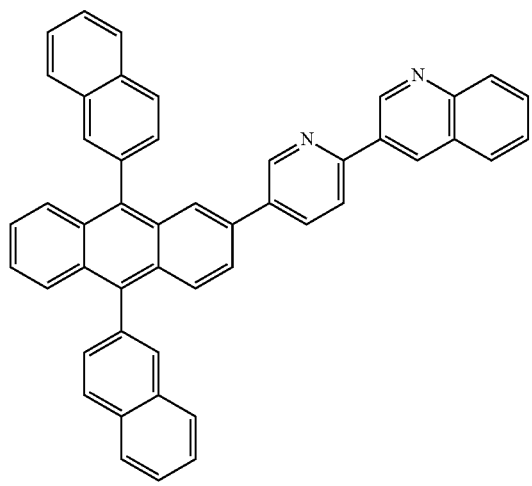
ET12
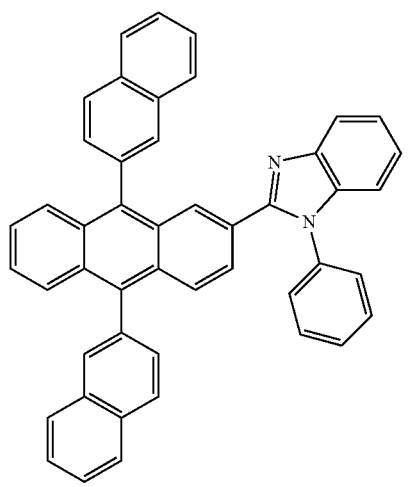
ET13
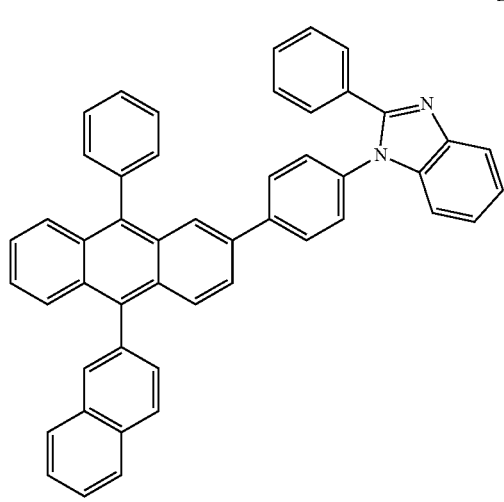
ET14
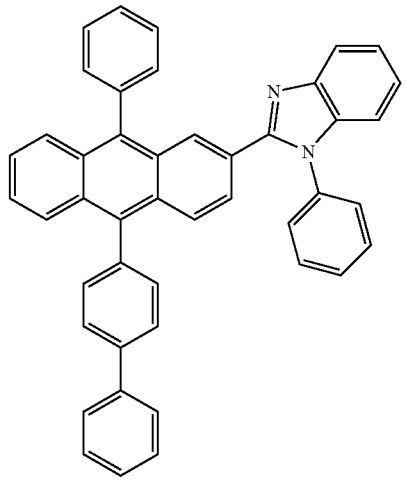
ET15
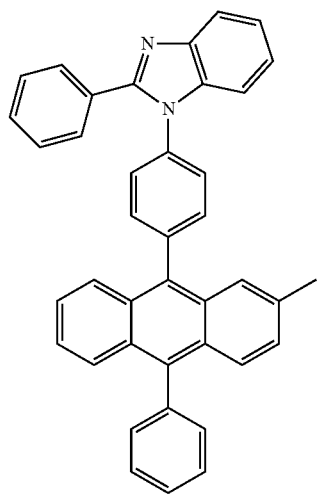
ET16
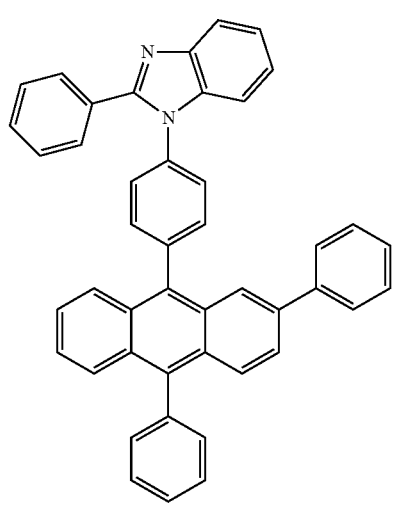

ET17
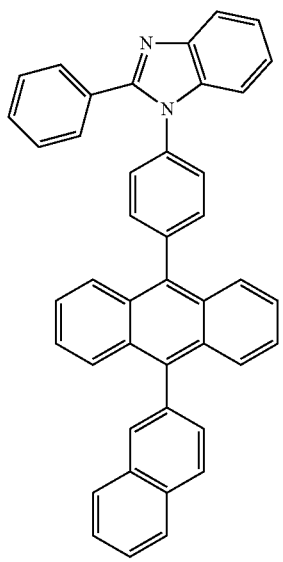
ET18
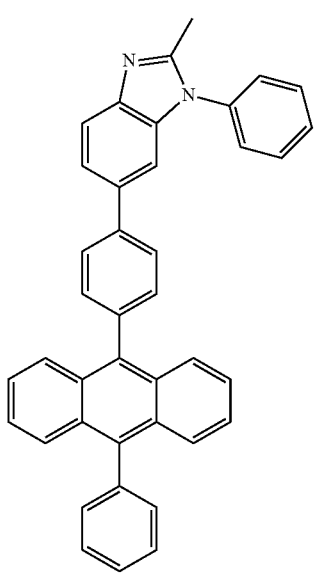
ET19
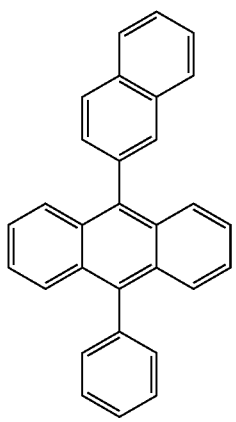
ET20
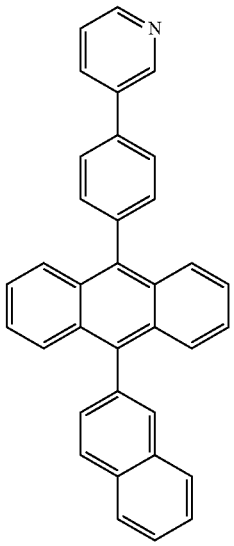
ET21
ET22
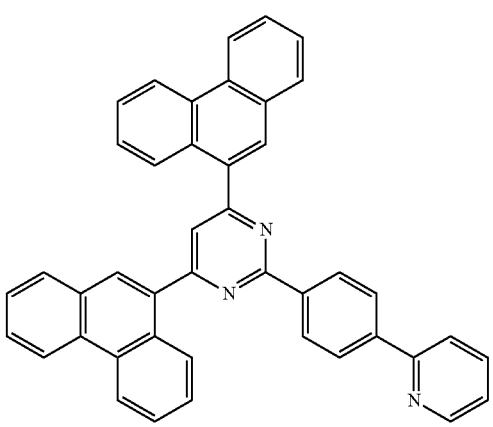

ET23
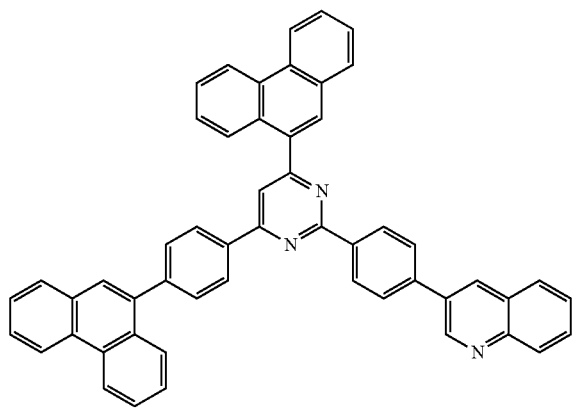
ET24
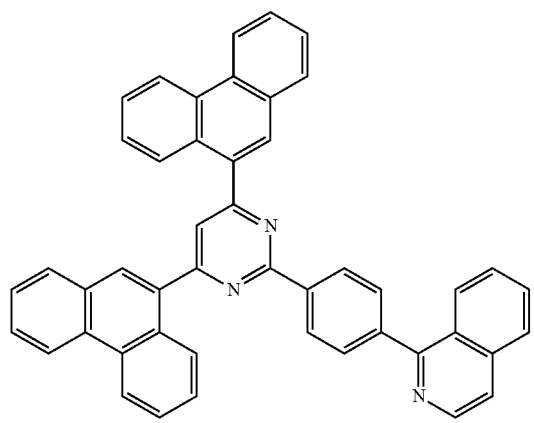
ET25
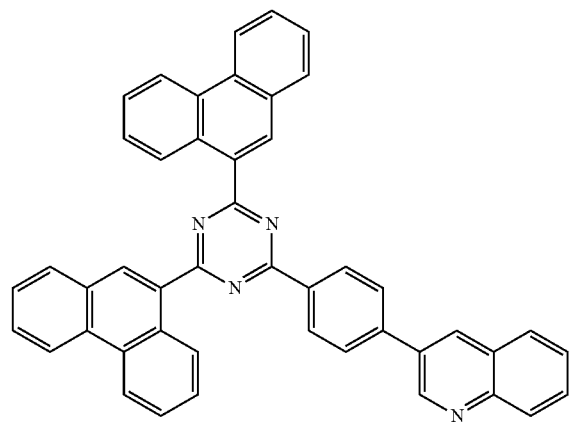
ET26
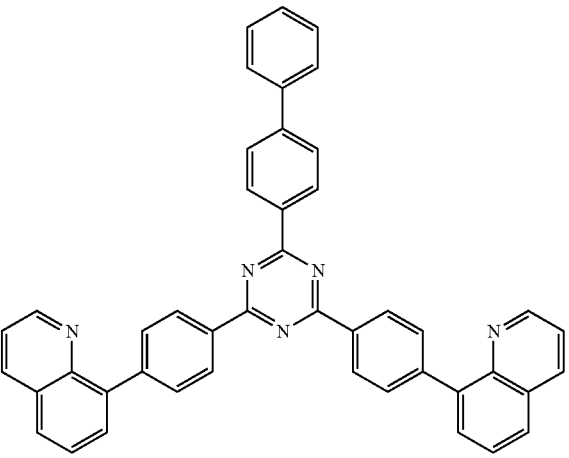
ET27
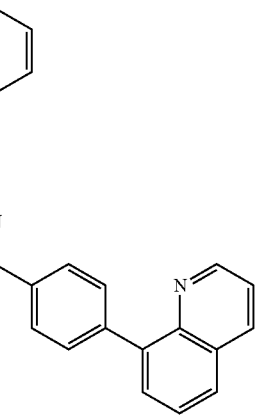
ET28
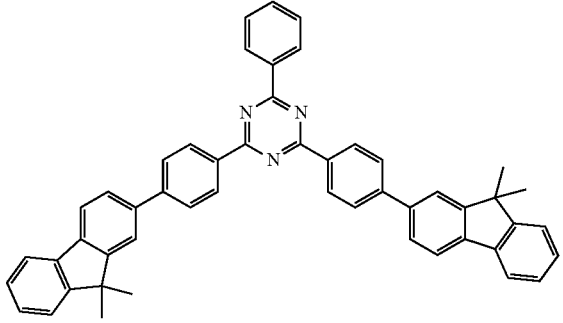

ET29
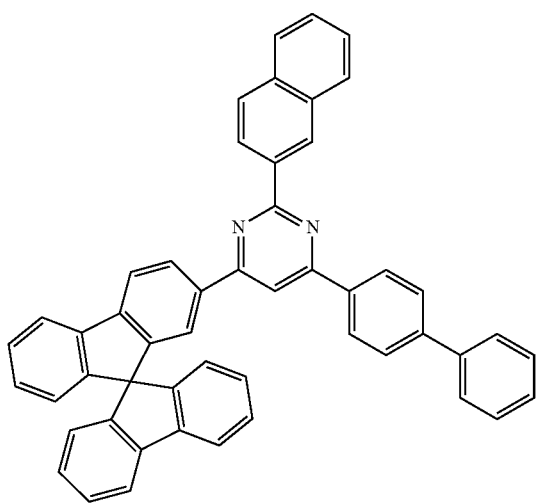
ET30
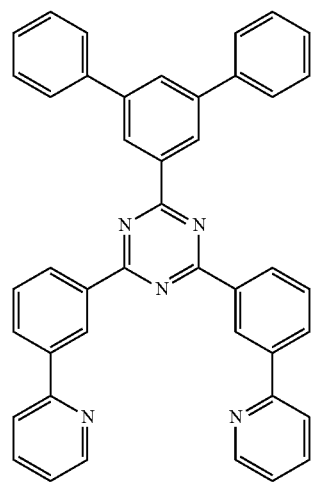
ET31
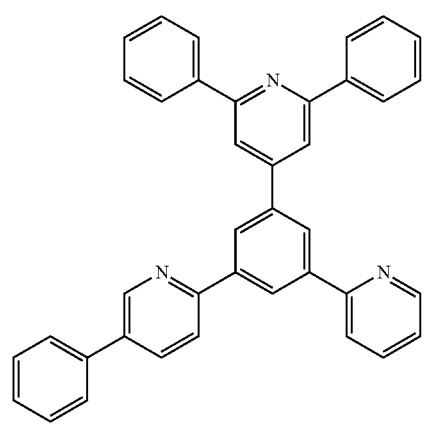
ET32
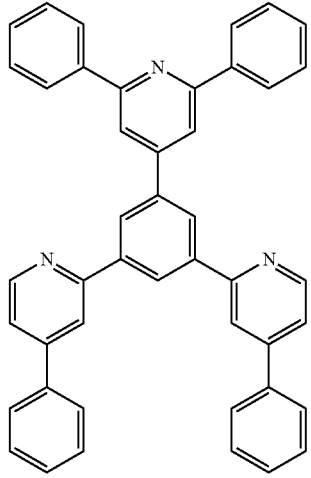
ET33
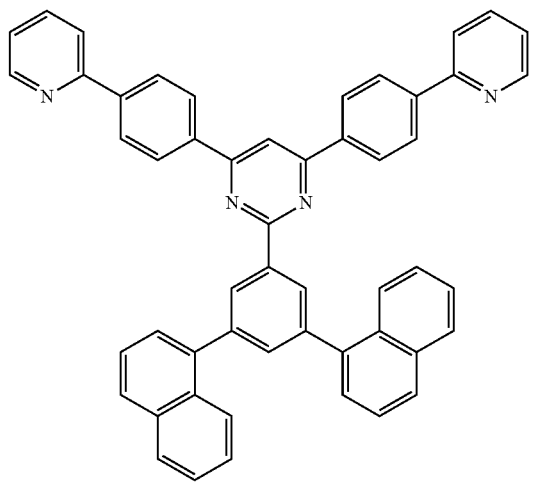
ET34
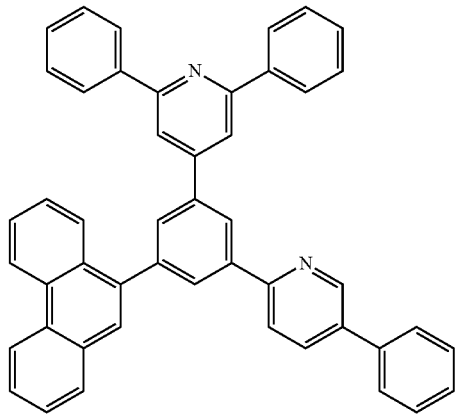

ET35
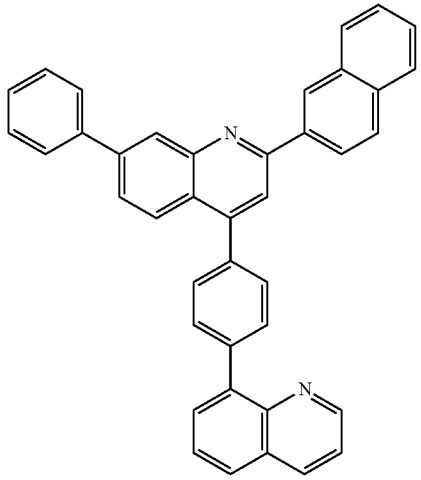
ET39
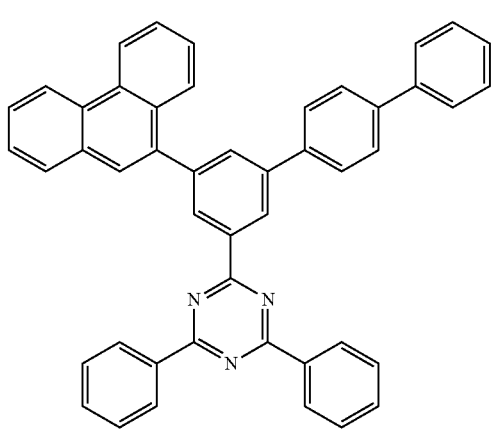
ET36
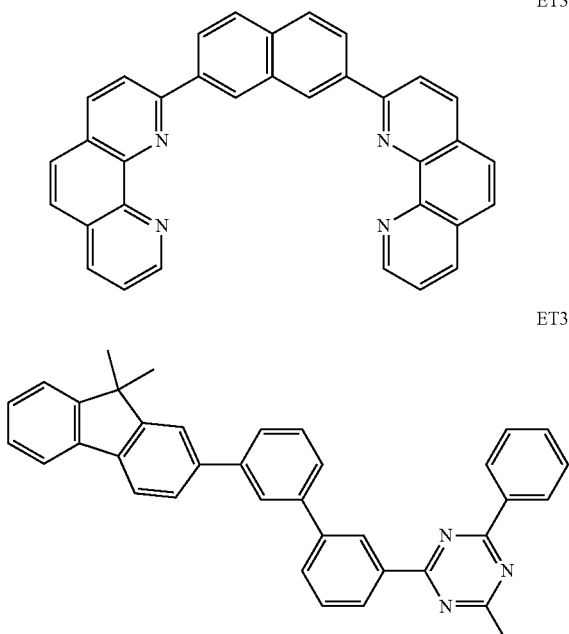
ET40
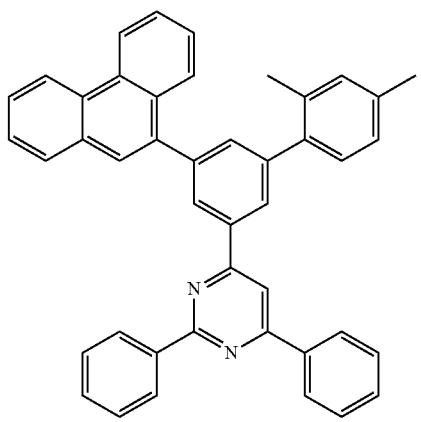
ET37
ET41
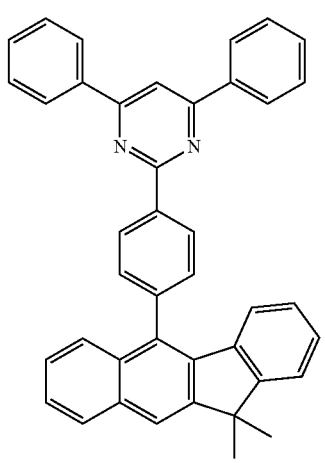
ET38
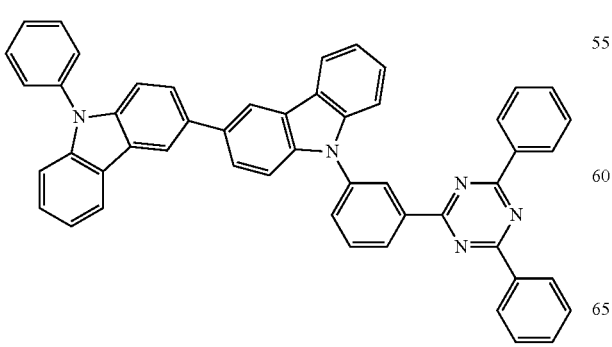

-continued

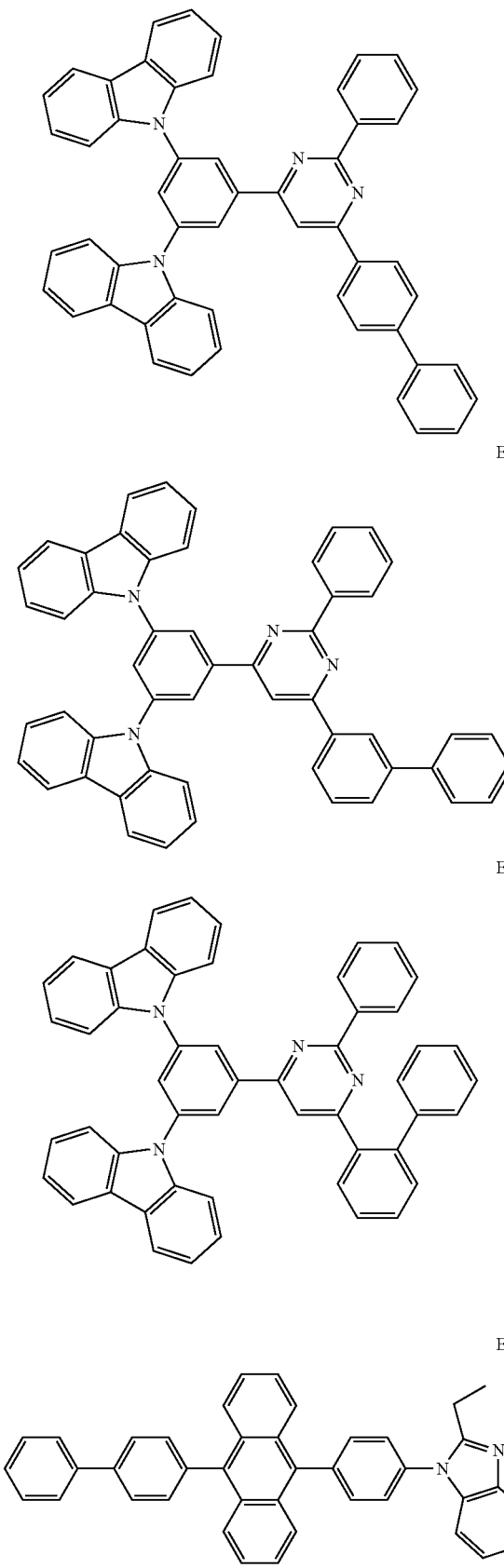

ET42

ET43

ET44

ET45

-continued

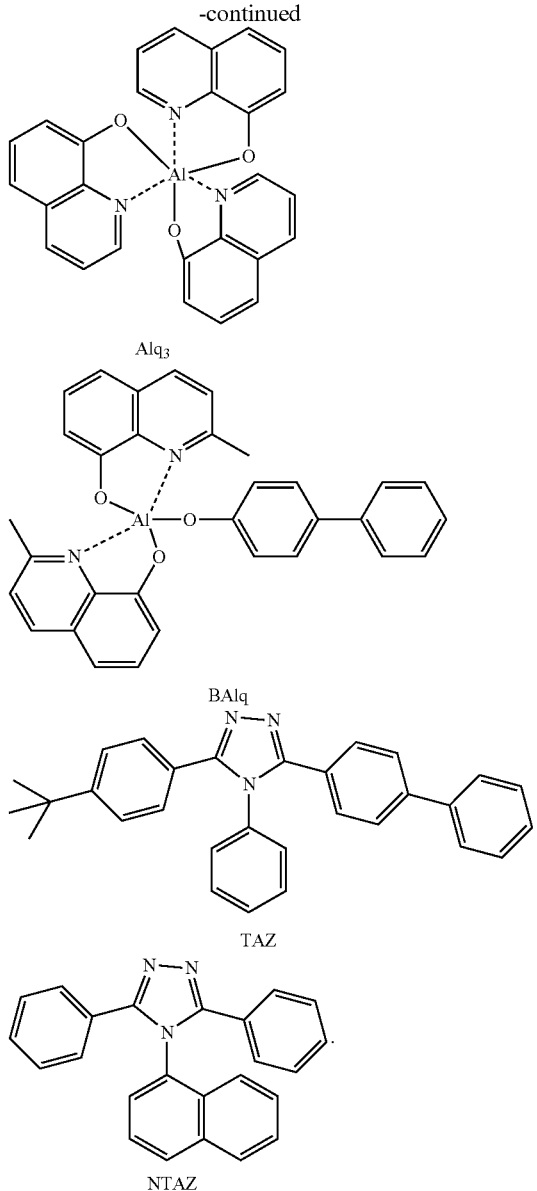

Alq₃

BAlq

TAZ

NTAZ

A thickness of the electron transport region may be in a range of about 50 Å to about 5,000 Å, for example, about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, hole-blocking layer, electron control layer, electron transport layer and/or electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The alkali metal complex may include a Li ion, a Na ion, a K ion, a Rb ion, or a Cs ion, and the alkaline earth metal complex may include a Be ion, a Mg ion, a Ca ion, a Sr ion, or a Ba ion. The alkali metal complex and the alkaline earth metal complex may independently include a ligand selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, and combinations thereof.

In an embodiment, the metal-containing material may include a Li complex. The Li complex may include for example, Compound ET-D1 (Liq) or ET-D2:

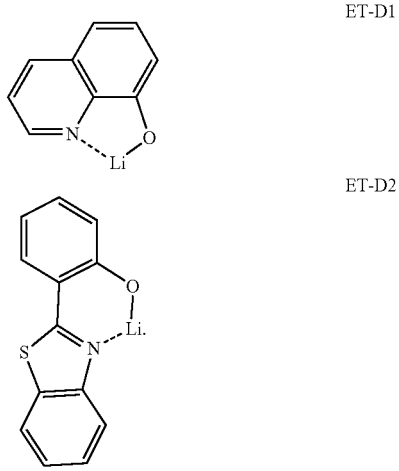

ET-D1

ET-D2

The electron transport region may include an electron injection layer to facilitate injection of electrons from the second electrode 150. The electron injection layer may be in direct contact with the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof.

The alkali metal may include lithium (Li), sodium (Na), potassium (K), rubidium (Rb), cesium (Cs), or any combination thereof. The alkaline earth metal may include magnesium (Mg), calcium (Ca), strontium (Sr), barium (Ba), or any combination thereof. The rare earth metal may include scandium (Sc), yttrium (Y), cerium (Ce), terbium (Tb), ytterbium (Yb), gadolinium (Gd), or any combination thereof.

The alkali metal-containing compound, the alkaline earth metal-containing compound, and the rare earth metal-containing compound may respectively be oxides, halides (for example, fluorides, chlorides, bromides, and/or iodides), and/or tellurides of the alkali metal, the alkaline earth metal, and the rare earth metal, or any combination thereof.

The alkali metal-containing compound may include: alkali metal oxides (such as $Li_2O$, $Cs_2O$, and/or $K_2O$); alkali metal halides (such as LiF, NaF, CsF, KF, LiI, NaI, CsI, and/or KI); or any combination thereof. The alkaline earth metal-containing compound may include an alkaline earth metal oxide (such as BaO, SrO, CaO, $Ba_xSr_{1-x}O$ (wherein x is a real number satisfying the condition of 0<x<1), $Ba_xCa_{1-x}O$ (wherein x is a real number satisfying the condition of 0<x<1), and/or the like). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may include i) one alkali metal ion, alkaline earth metal ion, or rare earth metal ion, respectively, and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In an embodiment, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

When the electron injection layer further includes an organic material, the alkali metal, the alkaline earth metal, the rare earth metal, an alkali metal-containing compound, an alkaline earth metal-containing compound, a rare earth metal-containing compound, an alkali metal complex, an alkaline earth-metal complex, a rare earth metal complex, or any combination thereof may be substantially homogeneously or non-homogeneously dispersed in a matrix including (or with) the organic material.

A thickness of the electron injection layer may be in a range of about 1 Å to about 100 Å, for example, about 3 Å to about 90 Å. When the thickness of the electron injection layer is within this range, satisfactory electron injection characteristics may be obtained without a substantial increase in driving voltage.

Second Electrode 150

The second electrode 150 may be located on the interlayer 130 having a structure as described above. The second electrode 150 may be a cathode (which is an electron injection electrode), and as a material for forming the second electrode 150, a metal, an alloy, an electrically conductive compound, or any combination thereof, each having a low work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be located outside the first electrode 110, and/or a second capping layer may be located outside the second electrode 150. For example, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110 (which is a semi-transmissive electrode or a transmissive electrode) and the first capping layer. Light generated in an emission layer of the interlayer 130 of the light-emitting device 10 may be extracted toward the outside through the second electrode 150 (which is a semi-transmissive electrode or a transmissive electrode) and the second capping layer.

The first capping layer and the second capping layer may increase the external luminescence efficiency of the device according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent including O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33 one of Compounds CP1 to CP6, β-NPB, or any combination thereof:

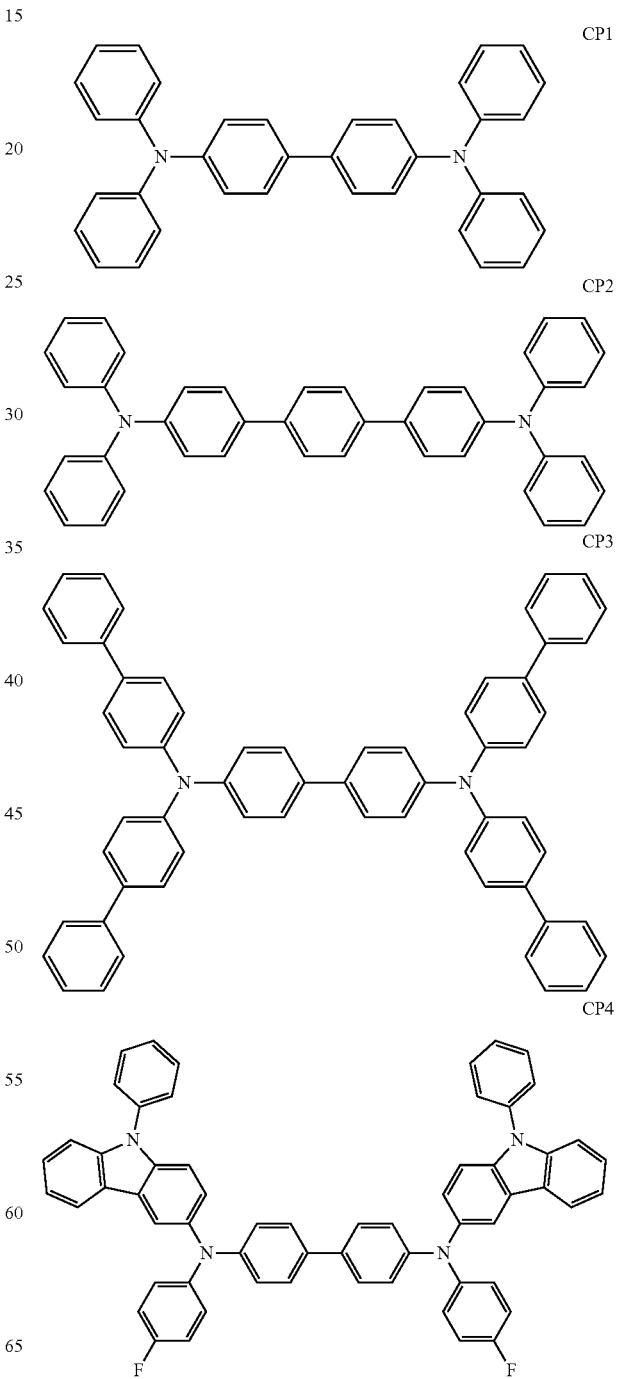

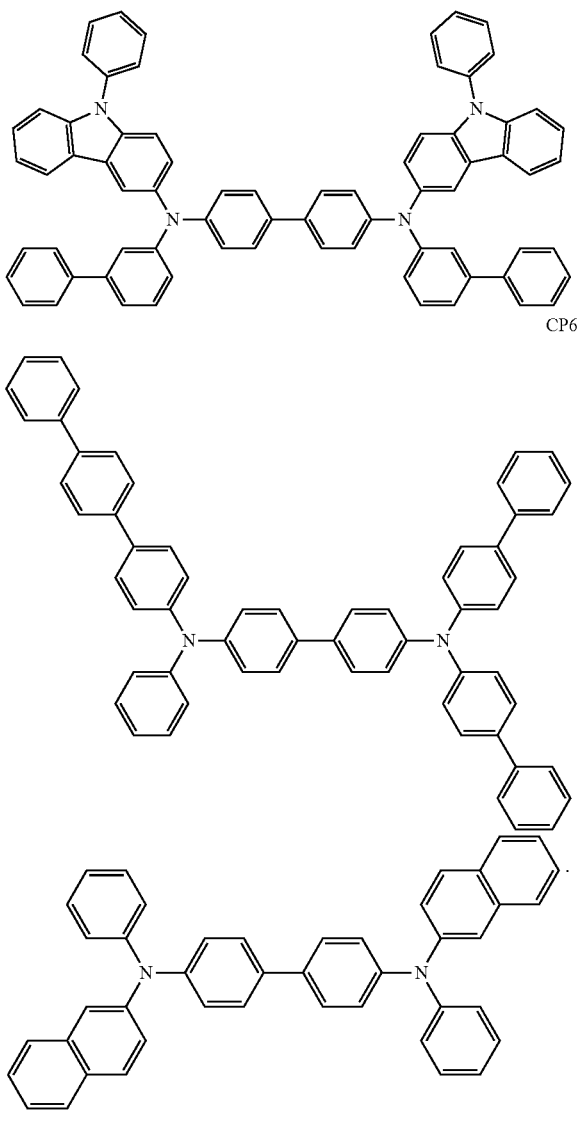

β-NPB

Electronic Apparatus

The light-emitting device 10 may be included in one or more suitable electronic apparatuses. In an embodiment, an electronic apparatus including the light-emitting device 10 may be an emission apparatus or an authentication apparatus.

The electronic apparatus (for example, an emission apparatus) may further include, in addition to the light-emitting device 10, i) a color filter, ii) a color-conversion layer, or iii) a color filter and a color-conversion layer. The color filter and/or the color-conversion layer may be located on (e.g., intersecting) at least one traveling direction of light emitted from the light-emitting device 10. In an embodiment, light emitted from the light-emitting device 10 may be blue light or white light. The light-emitting device 10 may be the same as described above. In an embodiment, the color conversion layer may include a quantum dot. The quantum dot may be, for example, the quantum dot as described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel-defining film (or referred to "pixel-define layer") may be located between the plurality of sub-pixel areas to define each sub-pixel area.

The color filter may further include a plurality of color filter areas and light-shielding patterns between the plurality of color filter areas, and the color conversion layer may further include a plurality of color conversion areas and light-shielding patterns between the plurality of color conversion areas.

The plurality of color filter areas (or the plurality of color conversion areas) may include a first area to emit first-color light, a second area to emit second-color light, and/or a third area to emit third-color light, wherein the first-color light, the second-color light, and/or the third-color light may have different maximum emission wavelengths from one another. In an embodiment, the first-color light may be red light, the second-color light may be green light, and the third-color light may be blue light. In an embodiment, the plurality of color filter areas (or the plurality of color conversion areas) may each include quantum dots. For example, the first area may include red quantum dots, the second area may include green quantum dots, and the third area may not include (e.g., may exclude) a quantum dot. The quantum dots may be the same as described herein. The first area, the second area, and/or the third area may each further include a scatterer.

In an embodiment, the light-emitting device 10 may be to emit first light, the first area may be to absorb the first light to emit first first-color light, the second area may be to absorb the first light to emit second first-color light, and the third area may be to absorb the first light to emit third first-color light. In this regard, the first first-color light, the second first-color light, and the third first-color light may have different maximum emission wavelengths from one another. For example, the first light may be blue light, the first first-color light may be red light, the second first-color light may be green light, and the third first-color light may be blue light.

The electronic apparatus may further include a thin-film transistor, in addition to the light-emitting device 10. The thin-film transistor may include a source electrode, a drain electrode, and an activation layer, and any one of the source electrode and the drain electrode may be electrically connected to one of the first electrode 110 and the second electrode 150 of the light-emitting device 10.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion that seals the light-emitting device 10. The sealing portion may be located between the color filter and/or color conversion layer and the light-emitting device 10. The sealing portion allows light from the light-emitting device 10 to be extracted to the outside, and concurrently (e.g., simultaneously) prevents ambient air and/or moisture from penetrating into the light-emitting device 10. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the intended use of the electronic apparatus. Examples of the functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device 10, a biometric information collector.

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and/or the like.

Figure 4:
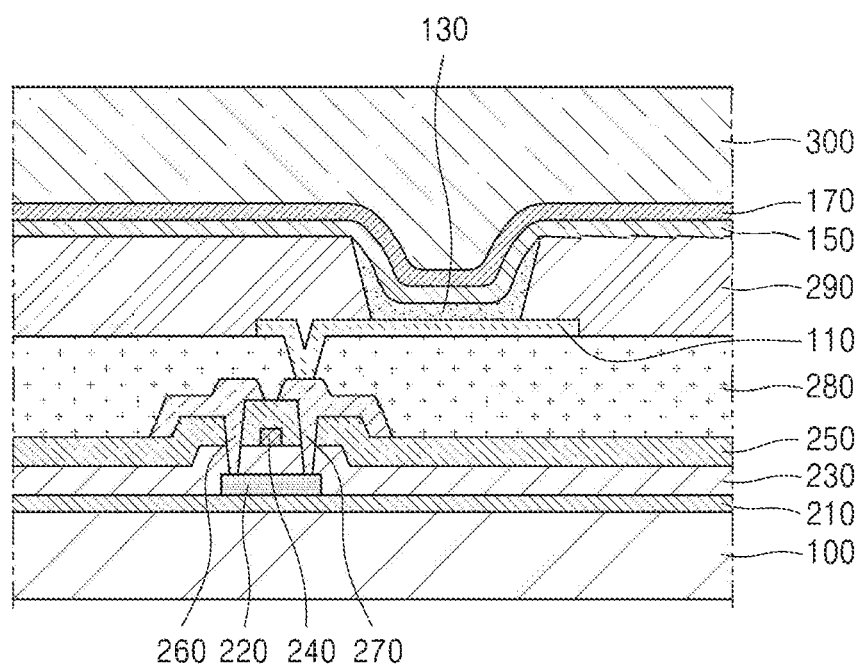
FIG. 4 is a diagram schematically illustrating the structure of an electronic apparatus according to an embodiment.
Figure 5:
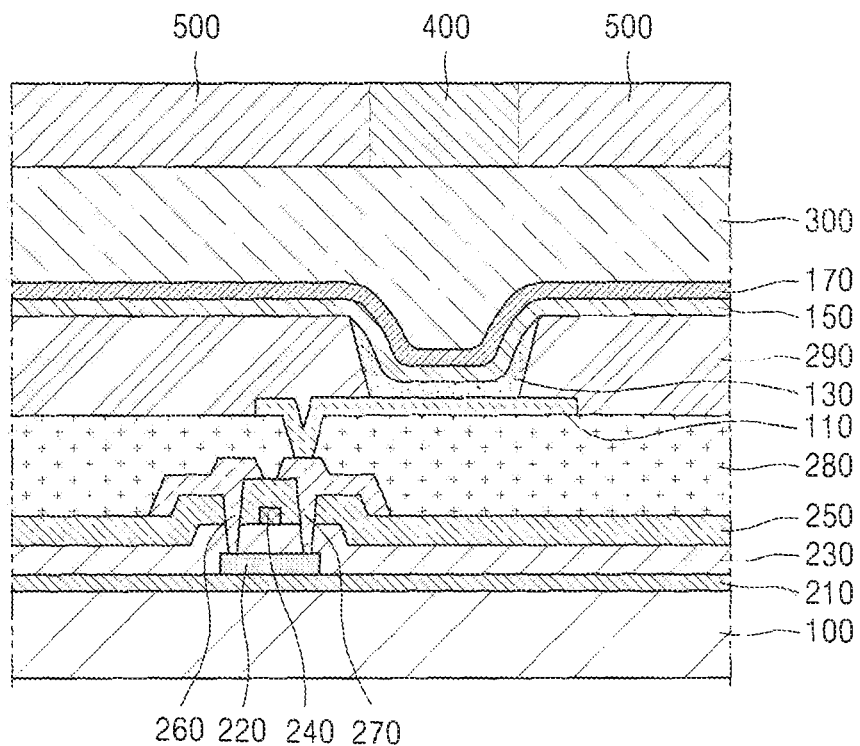
FIG. 5 is a diagram schematically illustrating the structure of an electronic apparatus according to another embodiment.

Description of FIGS. 4 and 5

FIG. 4 is a cross-sectional view of a light-emitting apparatus according to an embodiment.

The light-emitting apparatus of FIG. 4 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be located on the substrate 100. The buffer layer 210 may prevent or reduce penetration of impurities through the substrate 100, and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor (such as silicon and/or polysilicon), an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, to insulate from one another.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and an interlayer 130 may be formed in the exposed region of the first electrode 110. The pixel defining layer 290 may be a polyimide or polyacrylic organic film. In some embodiments, at least some layers of the interlayer 130 may extend beyond the upper portion of the pixel defining layer 290 and may thus be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be arranged on the light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic films and the organic films.

FIG. 5 is a cross-sectional view of a light-emitting apparatus according to another embodiment.

The light-emitting apparatus of FIG. 5 is the same as the light-emitting apparatus of FIG. 4, except that a light-shielding pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 5 may be a tandem light-emitting device.

Manufacture Method

The respective layers included in the hole transport region, the emission layer, and the respective layers included in the electron transport region may be formed in a set or predetermined region by utilizing one or more suitable methods selected from vacuum deposition, spin coating, casting, Langmuir-Blodgett (LB) deposition, ink-jet printing, laser-printing, laser-induced thermal imaging, and/or the like.

When the layers constituting the hole transport region, the emission layer, and the layers constituting the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon only as a ring-forming atom and having 3 to 60 carbon atoms, and the term "$C_1$-$C_{60}$ heterocyclic group" as used herein refers to a cyclic group that has 1 to 60 carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group may have 3 to 61 ring-forming atoms.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has 3 to 60 carbon atoms and does not include *—N=*' as a ring-forming moiety. The term "π electron-deficient nitrogen-containing $C_1$-$C_{60}$ cyclic group" as used herein refers to a heterocyclic group that has 1 to 60 carbon atoms and includes *—N=*' as a ring-forming moiety.

In an embodiment,
- the $C_3$-$C_{60}$ carbocyclic group may be i) a T1 group (as defined below) or ii) a condensed cyclic group in which at least two T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group),
- the $C_1$-$C_{60}$ heterocyclic group may be i) a T2 group (as defined below), ii) a condensed cyclic group in which at least two T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.),
- the π electron-rich $C_3$-$C_{60}$ cyclic group may be i) a T1 group, ii) a condensed cyclic group in which at least two T1 groups are condensed with each other, iii) a T3 group (as defined below), iv) a condensed cyclic group in which at least two T3 groups are condensed with each other, or v) a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.),
- the π electron-deficient nitrogen-containing $C_1$-$C_{60}$ cyclic group may be i) a T4 group (as defined below), ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein may refer to a group condensed to any cyclic group, a monovalent group, or a polyvalent group (for example, a divalent group, a trivalent group, a tetravalent group, etc.), according to the structure of a formula (e.g., structural context) for which the corresponding term is used. In an embodiment, a "benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and/or a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a divalent non-aromatic condensed heteropolycyclic group.

The term "$C_1$-$C_{60}$ alkyl group" as used herein refers to a linear or branched aliphatic saturated hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and/or a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof may include an ethenyl group, a propenyl group, and/or a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof may include an ethynyl group and/or a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group), and examples thereof may include a methoxy group, an ethoxy group, and/or an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantyl group, a norbornyl group (or a bicyclo[2.2.1]heptyl group), a bicyclo[1.1.1]pentyl group, a bicyclo[2.1.1]hexyl group, and/or a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and/or a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" used herein refers to a monovalent cyclic group that has 3 to 10 carbon atoms and at least one carbon-carbon double bond in the ring thereof and no aromaticity, and examples thereof may include a cyclopentenyl group, a cyclohexenyl group, and/or a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and/or a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and/or an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and/or a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group having two or more rings condensed with each other, only carbon atoms as ring-forming atoms (for example, 8 to 60 carbon atoms), and having non-aromaticity throughout its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and/or an indenoanthracenyl group. The term "divalent non-aromatic condensed polycyclic group" as used herein refers to a divalent group having substantially the same structure as the monovalent non-aromatic condensed polycyclic group described above.

The term "monovalent non-aromatic condensed heteropolycyclic group" as used herein refers to a monovalent group having two or more rings condensed to each other, at least one heteroatom, in addition to carbon atoms (for example, including 2 to 60 carbon atoms), as a ring-forming atom, and no aromaticity in its entire molecular structure. Examples of the monovalent non-aromatic condensed heteropolycyclic group may include a 9,9-dihydroacridinyl group, and/or a 9H-xanthenyl group. The term "divalent non-aromatic condensed heteropolycyclic group" as used herein refers to a divalent group having substantially the same structure as the monovalent non-aromatic condensed heteropolycyclic group described above.

The term "$C_6$-$C_{60}$ aryloxy group" as used herein refers to —OA$_{102}$ (wherein A$_{102}$ is a $C_6$-$C_{60}$ aryl group), and the term "$C_6$-$C_{60}$ arylthio group" as used herein refers to —SA$_{103}$ (wherein A$_{103}$ is a $C_6$-$C_{60}$ aryl group).

The term "$C_7$-$C_{60}$ arylalkyl group" as used herein refers to -A$_{104}$A$_{105}$ (wherein A$_{104}$ is a $C_1$-$C_{54}$ alkylene group, and A$_{105}$ is a $C_6$-$C_{59}$ aryl group). The term "$C_2$-$C_{60}$ heteroarylalkyl group" as used herein refers to -A$_{106}$A$_{107}$ (wherein A$_{106}$ is a $C_1$-$C_{59}$ alkylene group, and A$_{107}$ is a $C_1$-$C_{59}$ heteroaryl group).

The term "R$_{10a}$" as used herein refers to:
  deuterium, —F, —Cl, —Br, —I, a hydroxyl group, a cyano group, or a nitro group;
  a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof;
  a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or
  —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$).
  Q$_{11}$ to Q$_{13}$, Q$_{21}$ to Q$_{23}$, and Q$_{31}$ to Q$_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as used herein refers to any atom other than a carbon atom. Examples of the heteroatom include O, S, N, P, Si, B, Ge, Se, and any combination thereof.

The term "third-row transition metal" used herein includes hafnium (Hf), tantalum (Ta), tungsten (W), rhenium (Re), osmium (Os), iridium (Ir), platinum (Pt), gold (Au), and/or the like.

"Ph" as used herein refers to a phenyl group, "Me" as used herein refers to a methyl group, "Et" as used herein refers to an ethyl group, "tert-Bu" or "Bu$^t$" as used herein refers to a tert-butyl group, and "OMe" as used herein refers to a methoxy group.

The term "biphenyl group" as used herein refers to "a phenyl group substituted with a phenyl group." For example, the "biphenyl group" belongs to "a substituted phenyl group" having a "$C_6$-$C_{60}$ aryl group" as a substituent.

The term "terphenyl group" as used herein refers to "a phenyl group substituted with a biphenyl group." The "terphenyl group" belongs to "a substituted phenyl group" having a "$C_6$-$C_{60}$ aryl group substituted with a $C_6$-$C_{60}$ aryl group" as a substituent.

* and *' as used herein, unless defined otherwise, each refer to a binding site to a neighboring atom in a corresponding formula or moiety.

Hereinafter, a light-emitting device and the inorganic oxide particle compound according to one or more embodiments will be described in more detail with reference to Examples.

EXAMPLES

Preparation Example: Preparation of Inorganic Oxide Particle

Inorganic oxide particles according to Preparation Examples 1 and 2 and Comparative Preparation Examples 1 to 3 were respectively prepared by mixing each compound according to a content (e.g., amount) ratio shown in Table 1, followed by reacting at 50° C. for 5 minutes.

TABLE 1

| Composition | Inorganic oxide core precursor | Type of proton supply compound | Concentration of proton supply compound | Heating condition |
|---|---|---|---|---|
| Preparation Example 1 | ZnMgO | Cumene hydroperoxide | 0.1 wt % | 50° C., 5 min. |
| Preparation Example 2 | ZnMgO | Isobutyric acid | 0.1 wt % | 50° C., 5 min. |
| Comparative Preparation Example 1 | ZnMgO | — | — | — |
| Comparative Preparation Example 2 | ZnMgO | H$_2$O | 0.1 wt % | 50° C., 5 min. |
| Comparative Preparation Example 3 | ZnMgO | EtOH | 0.1 wt % | 50° C., 5 min. |

Evaluation Example 1

Trap emission at a light emission wavelength of 520 nm in each of the inorganic oxide particles prepared according to Preparation Examples 1 and 2 and Comparative Preparation Examples 1 to 3 was measured by utilizing a PL spectrometer (Hitachi), and the results are shown in Table 2.

Example 1

An ITO glass substrate (50 mm×50 mm, 15 Ω/cm$^2$), which is an OLED glass (manufactured by Samsung-Corning) substrate, was subjected to ultrasonic cleaning sequentially utilizing distilled water and isopropanol, followed by UV ozone cleaning for 30 minutes. A second composition (solvent: ethanol, inorganic oxide particle: 5 parts by weight (based on 100 parts by weight of solvent)) including the inorganic oxide particle prepared according to Preparation Example 1 was spin-coated on the glass substrate to form a film having a thickness of 40 nm, followed by baking at 100° C. for 30 minutes to thereby form an inorganic oxide layer. An InP quantum dot composition (solvent: octane, InP: 0.7 wt %) was spin-coated on the inorganic oxide layer to form a film having a thickness of 20 nm, followed by baking at 120° C. for 10 minutes to thereby form an emission layer. The second composition (solvent: ethanol, inorganic oxide particle: 5 parts by weight (based on 100 parts by weight of solvent)) including the inorganic oxide particle prepared according to Preparation Example 1 was spin-coated on the emission layer to form a film having a thickness of 40 nm, followed by baking at 100° C. for 30 minutes to thereby form an inorganic oxide layer. Al was deposited on the inorganic oxide layer to form a cathode having a thickness of 100 nm, thereby completing the manufacture of an electron only device (EOD). Then, heating was further performed at 75° C. for 24 hours. The equipment utilized for the deposition was a Suicel plus 200 evaporator from Sunic Systems.

Example 2 and Comparative Examples 1 to 3

Additional EODs were manufactured in substantially the same manner as in Example 1, except that the inorganic oxide particle included in the second composition was changed as shown in Table 2.

Evaluation Example 2

The driving voltage at a current density of 10 mA/cm$^2$ for each of the EODs manufactured in Examples 1 and 2 and Comparative Examples 1 to 3 was measured by utilizing a current-voltmeter (Keithley SMU 236), and the results are shown in Table 2.

TABLE 2

| | Inorganic oxide particle | Driving voltage (eV) | Trap emission (a.u.) |
|---|---|---|---|
| Example 1 | Preparation Example 1 | 1.6 | 6,700 |
| Example 2 | Preparation Example 2 | 1.5 | 3,100 |
| Comparative Example 1 | Comparative Preparation Example 1 | 4.5 | 9,700 |
| Comparative Example 2 | Comparative Preparation Example 2 | 4.0 | 7,600 |
| Comparative Example 3 | Comparative Preparation Example 3 | 4.2 | 8,500 |

As shown in Table 2, the inorganic oxide particles of Preparation Examples 1 and 2, which were prepared through reaction with a proton supply compound including a carboxylic acid-containing compound or peroxide-containing compound, each had a significant decrease in trap emission, as compared with the inorganic oxide particles of Comparative Preparation Examples 1 to 3, which were prepared without utilizing the proton supply compound including a carboxylic acid-containing compound or peroxide-containing compound.

Accordingly, the EODs of Examples 1 and 2 had improved driving voltages, as compared with the EODs of Comparative Examples 1 to 3.

The inorganic oxide particle prepared according to the method of manufacturing an inorganic oxide particle according to an embodiment may reduce oxygen vacancy on the surface of the inorganic oxide particle. Accordingly, a light-emitting device including the inorganic oxide layer formed by utilizing the inorganic oxide particle may have improved electron injection and/or transport efficiency, luminescence efficiency, and/or lifespan.

Terms such as "substantially," "about," and "18" are used as terms of approximation and not as terms of degree, and are intended to account for the inherent deviations in measured or calculated values that would be recognized by those of ordinary skill in the art. They may be inclusive of the stated value and an acceptable range of deviation as determined by one of ordinary skill in the art, considering the limitations and error associated with measurement of that quantity. For example, "about" may refer to one or more standard deviations, or ±30%, 20%, 10%, 5% of the stated value.

Numerical ranges disclosed herein include and are intended to disclose all subsumed sub-ranges of the same numerical precision. For example, a range of "1.0 to 10.0" includes all subranges having a minimum value equal to or greater than 1.0 and a maximum value equal to or less than 10.0, such as, for example, 2.4 to 7.6. Applicant therefore reserves the right to amend this specification, including the claims, to expressly recite any sub-range subsumed within the ranges expressly recited herein.

It should be understood that the embodiments described herein should be considered in a descriptive sense only and not for purposes of limitation. Descriptions of features or aspects within each embodiment should typically be considered as being available for other similar features or aspects in other embodiments. While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A method of manufacturing an inorganic oxide particle comprising an inorganic oxide core and a hydroxyl group bonded to a surface of the inorganic oxide core, the method comprising:
   preparing a first composition, the first composition comprising an inorganic oxide core precursor and a proton supply compound; and
   heating the first composition,
   wherein the proton supply compound comprises a carboxylic acid-containing compound and/or a peroxide-containing compound, and
   wherein the hydroxyl group is bonded only to the surface of the inorganic oxide core.

2. The method of claim 1, wherein the inorganic oxide core precursor comprises an oxide represented by Formula 1:

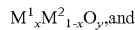  Formula 1 wherein, in Formula 1,
$M^1$ and $M^2$ are each independently Zn, Mg, Co, Mn, Y, Al, Ti, Zr, Sn, W, Ta, Ni, Mo, Cu, Ag, or a combination thereof, $0 \leq x \leq 1$, and $0 < y \leq 5$.

3. A method of manufacturing an inorganic oxide particle comprising an inorganic oxide core and a hydroxyl group bonded to a surface of the inorganic oxide core, the method comprising:
   preparing a first composition, the first composition comprising an inorganic oxide core precursor and a proton supply compound; and
   heating the first composition,
   wherein the proton supply compound comprises a carboxylic acid-containing compound and/or a peroxide-containing compound,
   wherein the carboxylic acid-containing compound is represented by Formula 2, and
   the peroxide-containing compound is represented by Formula 3:

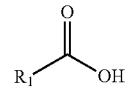  Formula 2

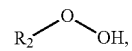  Formula 3 wherein, in Formulae 2 and 3,
$R_1$ and $R_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and
$R_{10a}$ is:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof; or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

4. The method of claim 1, wherein the first composition further comprises a first solvent, and the first solvent comprises an alcohol-based solvent, an ether-based solvent, an aliphatic hydrocarbon-based solvent, an aromatic hydrocarbon-based solvent, or any combination thereof.

5. The method of claim 1, wherein an amount of the proton supply compound in the first composition is in a range of about 0.01 parts by weight to about 30 parts by weight based on 100 parts by weight of the inorganic oxide core precursor.

6. The method of claim 1, wherein the heating of the first composition is performed at a temperature of 30° C. or higher.

7. A method of manufacturing an inorganic oxide layer comprising an inorganic oxide particle comprising an inorganic oxide core and a hydroxyl group bonded to a surface of the inorganic oxide core, the method comprising:

providing, on a substrate, a second composition comprising the inorganic oxide particle and a second solvent; and heating the second composition, wherein the hydroxyl group is bonded only to the surface of the inorganic oxide core.

8. The method of claim 7, wherein an average particle diameter (D50) of the inorganic oxide particle is in a range of about 1 nm to about 30 nm.

9. The method of claim 7, wherein the second solvent comprises an alcohol-based solvent, a chlorine-based solvent, an ether-based solvent, an ester-based solvent, a ketone-based solvent, an aliphatic hydrocarbon-based solvent, or any combination thereof.

10. The method of claim 7, wherein an amount of the inorganic oxide particle in the second composition is in a range of about 0.1 parts by weight to about 20 parts by weight based on 100 parts by weight of the second solvent.

11. The method of claim 7, wherein the heating of the second composition is performed at a temperature of 70° C. or higher.

12. A light-emitting device comprising:
a first electrode;
a second electrode facing the first electrode; and
an interlayer between the first electrode and the second electrode and comprising an emission layer and an inorganic oxide layer,
wherein the inorganic oxide layer is manufactured according to the method of claim 7.

13. The light-emitting device of claim 12, wherein a thickness of the inorganic oxide layer is in a range of about 5 nm to about 200 nm.

14. The light-emitting device of claim 12, wherein the interlayer further comprises:
a hole transport region located between the first electrode and the emission layer; and
an electron transport region located between the emission layer and the second electrode, and
wherein the electron transport region comprises the inorganic oxide layer.

15. The light-emitting device of claim 14, wherein the electron transport region comprises at least one layer selected from a buffer layer, a hole blocking layer, an electron control layer, an electron transport layer, and an electron injection layer, and
the inorganic oxide layer comprises at least one selected from the buffer layer, the hole blocking layer, the electron control layer, the electron transport layer, and the electron injection layer.

16. The light-emitting device of claim 12, wherein a thickness of the emission layer is in a range of about 5 nm to about 200 nm.

17. The light-emitting device of claim 12, wherein the emission layer comprises a quantum dot.

18. The light-emitting device of claim 17, wherein the quantum dot comprises a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

19. The light-emitting device of claim 17, wherein the quantum dot has a core-shell structure.

20. The light-emitting device of claim 17, wherein a diameter of the quantum dot is in a range of about 1 nm to about 20 nm.

* * * * *